(12) United States Patent
Du et al.

(10) Patent No.: US 12,367,835 B2
(45) Date of Patent: Jul. 22, 2025

(54) DISPLAY SUBSTRATE, PREPARATION METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Yuanjie Xu, Beijing (CN); Qiwei Wang, Beijing (CN); Benlian Wang, Beijing (CN); Yudiao Cheng, Beijing (CN); Pan Xu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 756 days.

(21) Appl. No.: 17/627,808

(22) PCT Filed: Apr. 30, 2021

(86) PCT No.: PCT/CN2021/091421
§ 371 (c)(1),
(2) Date: Jan. 17, 2022

(87) PCT Pub. No.: WO2022/160491
PCT Pub. Date: Aug. 4, 2022

(65) Prior Publication Data
US 2023/0157099 A1 May 18, 2023

(51) Int. Cl.
*G09G 3/3241* (2016.01)
*G09G 3/3233* (2016.01)
(Continued)

(52) U.S. Cl.
CPC ......... *G09G 3/3241* (2013.01); *G09G 3/3233* (2013.01); *H10K 59/1201* (2023.02);
(Continued)

(58) Field of Classification Search
CPC ...... G09G 3/32; G09G 3/3233; G09G 3/3241; G09G 2300/0426; G09G 2300/0819;
(Continued)

(56) References Cited

U.S. PATENT DOCUMENTS 9,835,917 B2   12/2017   Zhao et al.
10,879,319 B2  12/2020   Bang et al.
(Continued)

FOREIGN PATENT DOCUMENTS

CN   106057820 A   10/2016
CN   106707646 A   5/2017
(Continued)

OTHER PUBLICATIONS

European Search Report for 21922089.4 Mailed Sep. 19, 2023.
(Continued)

*Primary Examiner* — Amr A Awad
*Assistant Examiner* — Aaron Midkiff
(74) *Attorney, Agent, or Firm* — Ling Wu; Stephen Yang; Ling and Yang Intellectual Property

(57) ABSTRACT

Disclosed are a display substrate, a preparation method thereof, and a display device. The display substrate includes a display region and a bonding region on one side of the display region. The bonding region at least includes a lead area. The display region includes a plurality of data lines and a plurality of data fanout lines. The lead area includes a plurality of lead wires. Orthographic projections of the plurality of data lines and the plurality of data fanout lines on a plane of the display substrate are at least partially overlapped. A first end of at least one data fanout line is
(Continued)

connected to the lead wire, and a second end of the at least one data fanout line extends in a direction away from the lead area, to be connected to the data line.

17 Claims, 11 Drawing Sheets

(51) Int. Cl.
  *H10K 59/12* (2023.01)
  *H10K 59/121* (2023.01)
  *H10K 59/131* (2023.01)
  *H10K 59/35* (2023.01)

(52) U.S. Cl.
  CPC ..... *H10K 59/1213* (2023.02); *H10K 59/1216* (2023.02); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *H10K 59/1315* (2023.02); *H10K 59/35* (2023.02)

(58) Field of Classification Search
  CPC ............. G09G 2300/0842; G09G 2300/0861; G09G 2310/0251; G09G 2310/061; G09G 2310/08; G09G 2320/0204; G09G 3/3275; G09G 2300/0408; G09G 2310/0262–0278; H10K 59/1201; H10K 59/1213; H10K 59/1216; H10K 59/131; H10K 59/1315; H10K 59/35; G02F 1/1362
  See application file for complete search history.

(56) References Cited

U.S. PATENT DOCUMENTS

| | | | |
|---|---|---|---|
| 10,978,447 B2 | 4/2021 | Kim et al. | |
| 11,183,543 B2 | 11/2021 | Bang et al. | |
| 11,625,069 B2 | 4/2023 | Bang et al. | |
| 11,678,537 B2 | 6/2023 | Choi et al. | |
| 11,871,624 B2 | 1/2024 | Son et al. | |
| 11,943,956 B2 | 3/2024 | Woo et al. | |
| 2013/0033834 A1 | 2/2013 | Kwon et al. | |
| 2015/0001482 A1 | 1/2015 | Jung | |
| 2015/0123882 A1 | 5/2015 | Hsu | |
| 2016/0041433 A1 | 2/2016 | Zhang et al. | |
| 2016/0225304 A1* | 8/2016 | Kim | G09G 3/3666 |
| 2018/0173346 A1 | 6/2018 | Du et al. | |
| 2018/0197484 A1 | 7/2018 | Moon et al. | |
| 2019/0326336 A1 | 10/2019 | Xi et al. | |
| 2020/0013833 A1 | 1/2020 | Wang et al. | |
| 2020/0090559 A1 | 3/2020 | Song et al. | |
| 2020/0110497 A1 | 4/2020 | Jin et al. | |
| 2020/0174525 A1 | 6/2020 | Feng | |
| 2020/0227503 A1 | 7/2020 | Yi et al. | |
| 2020/0312252 A1 | 10/2020 | Jeong et al. | |
| 2020/0342791 A1 | 10/2020 | Song et al. | |
| 2020/0343331 A1 | 10/2020 | Jeong et al. | |
| 2020/0388230 A1 | 12/2020 | Lee | |
| 2021/0005631 A1 | 1/2021 | Wang et al. | |
| 2021/0013287 A1 | 1/2021 | Bang et al. | |
| 2021/0013297 A1 | 1/2021 | Okabe et al. | |
| 2021/0020724 A1 | 1/2021 | Cho et al. | |
| 2021/0027717 A1 | 1/2021 | Kim | |
| 2021/0083036 A1 | 3/2021 | Kang et al. | |
| 2021/0090490 A1 | 3/2021 | Lee et al. | |
| 2021/0118976 A1 | 4/2021 | Zhao et al. | |
| 2021/0233899 A1 | 7/2021 | Lu | |
| 2021/0257435 A1 | 8/2021 | Kim et al. | |
| 2021/0273035 A1 | 9/2021 | Cho et al. | |
| 2021/0399262 A1 | 12/2021 | Woo et al. | |
| 2021/0408214 A1 | 12/2021 | Wang et al. | |

FOREIGN PATENT DOCUMENTS

| | | |
|---|---|---|
| CN | 106782270 A | 5/2017 |
| CN | 107170783 A | 9/2017 |
| CN | 107656646 A | 2/2018 |
| CN | 107919090 A | 4/2018 |
| CN | 108153438 A | 6/2018 |
| CN | 108319397 A | 7/2018 |
| CN | 208444523 U | 1/2019 |
| CN | 109448555 A | 3/2019 |
| CN | 109449196 A | 3/2019 |
| CN | 109541865 A | 3/2019 |
| CN | 110085643 A | 8/2019 |
| CN | 110148606 A | 8/2019 |
| CN | 110286534 A | 9/2019 |
| CN | 110531559 A | 12/2019 |
| CN | 110910774 A | 3/2020 |
| CN | 110911444 A | 3/2020 |
| CN | 111384066 A | 7/2020 |
| CN | 111430408 A | 7/2020 |
| CN | 111522463 A | 8/2020 |
| CN | 111653603 A | 9/2020 |
| CN | 111665995 A | 9/2020 |
| CN | 111722762 A | 9/2020 |
| CN | 111755476 A | 10/2020 |
| CN | 111886925 A | 11/2020 |
| CN | 112054038 A | 12/2020 |
| CN | 112180644 A | 1/2021 |
| CN | 112185267 A | 1/2021 |
| CN | 112186022 A | 1/2021 |
| CN | 112201680 A | 1/2021 |
| CN | 112216721 A | 1/2021 |
| CN | 112242425 A | 1/2021 |
| CN | 112255852 A | 1/2021 |
| CN | 112310125 A | 2/2021 |
| CN | 112310150 A | 2/2021 |
| CN | 112510066 A | 3/2021 |
| EP | 3748682 A1 | 12/2020 |
| JP | 2000-28642 A | 1/2000 |
| TW | 201518748 A | 5/2015 |
| WO | 2015081672 A1 | 6/2015 |
| WO | 2020017835 A1 | 1/2020 |

OTHER PUBLICATIONS

European Search Report for 21922090.2 Mailed Sep. 21, 2023.
Office Action dated May 2, 2024 for U.S. Appl. No. 17/629,772.
Office Action dated Jul. 8, 2024 for U.S. Appl. No. 17/640,230.

* cited by examiner

DISPLAY SUBSTRATE, PREPARATION METHOD THEREOF, AND DISPLAY DEVICE

CROSS-REFERENCE TO RELATED APPLICATIONS

The present application is a U.S. National Phase Entry of International Application No. PCT/CN2021/091421 having an international filing date of Apr. 30, 2021, which claims priority to PCT Application No. PCT/CN2021/074469, filed on Jan. 29, 2021 and entitled "Display Substrate and Display Device". The above-identified applications are hereby incorporated by reference in their entireties.

TECHNICAL FIELD

The present disclosure relates to, but is not limited to, the field of display technologies, and particularly to a display substrate, a preparation method thereof, and a display device.

BACKGROUND

An Organic Light Emitting Diode (OLED for short) is an active light emitting display device, having the advantages such as self-illumination, wide viewing angle, high contrast, low power consumption, and extremely high response speed. With the constant development of display technologies, a display device using an OLED as an emitting device and a Thin Film Transistor (TFT for short) for signal control has become a mainstream product in the field of display at present.

SUMMARY

The below is a summary about the subject matter described in the present disclosure in detail. The summary is not intended to limit the scope of protection of the claims.

According to an aspect, an exemplary embodiment of the present disclosure provides a display substrate, including a display region and a bonding region on one side of the display region; the bonding region at least includes a lead area; the display region includes a plurality of data lines and a plurality of data fanout lines, the lead area includes a plurality of lead wires, orthographic projections of the plurality of data lines and the plurality of data fanout lines on a plane of the display substrate are at least partially overlapped; a first end of at least one data fanout line is connected to a lead wire, and a second end of the at least one data fanout line extends in a direction away from the lead area, to be connected to a data line.

In an exemplary implementation mode, the number of the data fanout lines is equal to the number of the data lines.

In an exemplary implementation mode, in a plane parallel to the display substrate, the display substrate has a first center line, and the first center line extends along a first direction and equally divides pixel columns of the display region, the first direction being parallel to the data lines; on one side of the first center line, the plurality of data lines include a first data line, a second data line, . . . , and an Nth data line that are arranged in sequence along a second direction or an opposite direction of the second direction, the second direction intersecting the first direction; the plurality of data fanout lines include a first data fanout line, a second data fanout line, . . . , and an Nth data fanout line that are arranged in sequence along the second direction or the opposite direction of the second direction; the plurality of lead wires include a first lead wire, a second lead wire, . . . , and an Nth lead wire that are arranged in sequence along the second direction or the opposite direction of the second direction; an orthographic projection of any one of the data fanout lines on the plane of the display substrate and orthographic projections of other data fanout lines on the plane of the display substrate have no overlap region; an orthographic projection of any one of the lead wires on the plane of the display substrate and orthographic projections of other lead wires on the plane of the display substrate have no overlap region; and N refers to the number of the data lines in the display region.

In an exemplary implementation, at least one data fanout line includes a first line segment and a second line segment; a first end of the first line segment is connected to the lead wire, and a second end of the first line segment extends along a second direction or an opposite direction of the second direction, to be connected to a first end of the second line segment; a second end of the second line segment extends in a direction away from the lead area, to be connected to the data line through a via; the second direction intersects the first direction, and the first direction is parallel to the data line.

In an exemplary implementation, the first line segment includes a lead-out segment and a first extension segment; a first end of the lead-out segment is connected to the lead wire, and a second end of the lead-out segment extends in a direction away from the lead area, to be connected to a first end of the first extension segment; a second end of the first extension segment extends along the second direction or the opposite direction of the second direction, to be connected to the first end of the second line segment; and a spacing between adjacent lead-out segments is less than a spacing between adjacent data lines.

In an exemplary implementation mode, a plurality of lead wires in the lead area have the same width, adjacent lead wires have the same spacing, and the spacing between the adjacent lead wires is less than a spacing between the adjacent data lines.

In an exemplary implementation, the second line segment includes a second extension segment and a connecting segment; a first end of the second extension segment is connected to the second end of the first line segment, and a second end of the second extension segment extends in a direction away from the lead area, to be connected to a first end of the connecting segment; and a second end of the connecting segment extends along the second direction or the opposite direction of the second direction, to be connected to the data line through a via.

In an exemplary implementation, in a plane parallel to the display substrate, the display substrate has a second center line, and the second center extends along the second direction and equally divides pixel rows of the display region; the via through which any one of the data fanout lines is connected to the data line has a distance L1 from the second center line, the distance L1 satisfying:

L1≤0.2*a length of the data line in the display region, where the length and the distance refer to dimensions in the first direction.

In an exemplary implementation, a plurality of vias through which the data fanout lines are connected with the data lines are located on the second center line.

In an exemplary implementation, any one of the data fanout lines has an extension length L2 in the display region, the extension length L2 satisfying:

$$|L2i-L2j|/L2i \leq 0.2, \text{ or } |L2i-L2j|/L2j \leq 0.2,$$

where L2i is an extension length of one data fanout line in the display region, L2j is an extension length of another data fanout line in the display region, and the extension length of the data fanout line is the sum of an extension length of the first line segment and an extension length of the second line segment.

In an exemplary implementation, a plurality of vias through which the data fanout lines are connected with the data lines have different distances from the second center line.

In an exemplary implementation mode, in a plane perpendicular to the display panel, the display substrate includes a first conductive layer, a second conductive layer, and a third conductive layer, and an insulating layer is arranged between the first conductive layer and the second conductive layer as well as between the second conductive layer and the third conductive layer; and the data lines and the data fanout lines are arranged in different conductive layers.

In an exemplary implementation, the data fanout lines include odd data fanout lines and even data fanout lines, the odd data fanout lines are connected to the data lines in odd columns, and the even data fanout lines are connected to the data lines in even columns; and the odd data fanout lines and the even data fanout lines are arranged in different conductive layers.

In an exemplary implementation, the lead wires include odd lead wires and even lead wires, the odd lead wires are connected to the data lines in odd columns through the odd data fanout lines, and the even lead wires are connected to the data lines in the even columns through the even data fanout lines; the odd lead wires and the odd data fanout lines are arranged in the same layer and are of an integrated structure connected to each other, and the even lead wires and the even data fanout lines are arranged in the same layer and are of an integrated structure connected to each other.

In an exemplary implementation, the odd data fanout lines are arranged in the first conductive layer, the even data fanout lines are arranged in the second conductive layer, and the data lines are arranged in the third conductive layer; or, the even data fanout lines are arranged in the first conductive layer, the odd data fanout lines are arranged in the second conductive layer, and the data lines are arranged in the third conductive layer; and the first conductive layer and the second conductive layer are made of the same material.

In an exemplary implementation mode, in the plane parallel to the display substrate, the display substrate includes a plurality of pixel islands, the pixel islands each including a plurality of sub-pixels; in the plane perpendicular to the display substrate, the sub-pixel includes a driving circuit layer arranged on a substrate and a light emitting structure layer arranged on a side, away from the substrate, of the driving circuit layer, the driving circuit layer including a pixel driving circuit, and the light emitting structure layer including a light emitting device connected to the pixel driving circuit.

At least one pixel island includes a circuit sub-area and a wiring sub-area, pixel driving circuits of the plurality of sub-pixels in the pixel island are arranged in the circuit sub-area, and the data fanout lines are arranged in the wiring sub-area.

In an exemplary implementation mode, an orthographic projection of at least one light emitting device in the pixel island on the plane of the display substrate and an orthographic projection of the data fanout line on the plane of the display substrate have an overlap region.

In an exemplary implementation mode, a virtual fanout line is further arranged in the wiring sub-area.

According to another aspect, an exemplary embodiment of the present disclosure also provides a display device, which includes the foregoing display substrate.

According to still another aspect, an exemplary embodiment of the present disclosure also provides a preparation method for a display substrate; the display substrate includes a display region and a bonding region on one side of the display region, the bonding region at least including a lead area; the preparation method includes the following operations.

A plurality of data lines and a plurality of data fanout lines are formed in the display region, and a plurality of lead wires are formed in the lead area, herein orthographic projections of the plurality of data lines and the plurality of data fanout lines on a plane of the display substrate are at least partially overlapped; a first end of at least one data fanout line is connected to the lead wire, and a second end of the at least one data fanout line is connected to the data line after the second end extends in a direction away from the lead area.

After the drawings and the detailed descriptions are read and understood, the other aspects may be comprehended.

BRIEF DESCRIPTION OF DRAWINGS

The accompanying drawings provide a further understanding to the technical solution of the present disclosure, form a part of the specification, and are adopted to explain, together with the embodiments of the present disclosure, the technical solutions of the present disclosure and not intended to form limits to the technical solutions of the present disclosure. The shapes and sizes of each component in the drawings do not reflect the true scale, and are only intended to schematically describe the contents of the present disclosure.

DESCRIPTION ABOUT THE REFERENCE SIGNS

Figure 1:
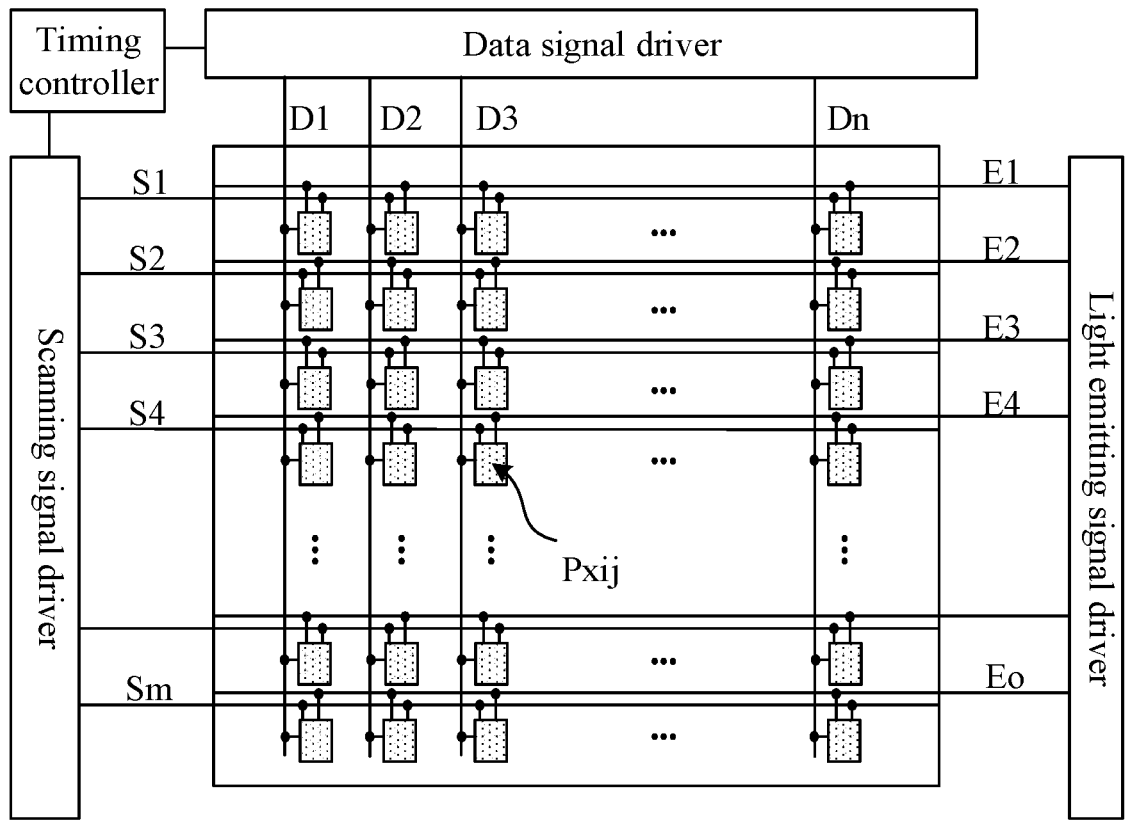
FIG. 1 is a schematic diagram of a structure of a display device.

10—display substrate; 11—first insulating layer; 12—second insulating layer;
13—third insulating layer: 14—fourth insulating layer; 20—integrated circuit;
30—flexible circuit board; 40—pixel driving circuit; 50—light emitting device;
100—display region; 101—substratesubstrate; 102—driving circuit layer;
102A—transistor; 102B—memory capacitor; 110—first wiring area;
120—second wiring area; 200—bonding region; 201—first fanout area;
202—bending area; 203—second fanout area; 204—antistatic area;
205—driver chip area; 206—bonding pin area; 300—border region;
301—anode; 302—pixel define layer; 303—organic light-emitting layer;
304—cathode; 401—first encapsulation layer; 402—second encapsulation layer;
403—third encapsulation layer; 500—bonding region; 501—lead area;
502—bending area; 503—composite circuit area; 600—lead wire;
700—data fanout line; and 750—virtual fanout line.

DETAILED DESCRIPTION

To make the objectives, technical solutions, and advantages of the present disclosure clearer, the embodiments of the present disclosure will be described in detail below in combination with the accompany drawings. It is to be noted that the implementation modes may be implemented in various forms. Those of ordinary skill in the art can easily understand such a fact that modes and contents may be transformed into various forms without departing from the purpose and scope of the present disclosure. Therefore, the present disclosure should not be explained as being limited to the contents recorded in the following implementation modes only. The embodiments in the present disclosure and the features in the embodiments can be freely combined if there is no conflicts. In order to keep the following description of the embodiments of the present disclosure clear and concise, detailed descriptions of part of known functions and known components are omitted in the present disclosure. The accompanying drawings of the embodiments of the present disclosure only involve the structures involved in the embodiments of the present disclosure, and the other structures may refer to conventional designs.

In the accompanying drawings, the size of each composition element, the thicknesses of layers, or regions may be exaggerated sometimes for clarity. Therefore, a mode of the present disclosure is not always limited to the size, and the shape and size of each component in the drawings do not reflect the true scale. In addition, the accompanying drawings schematically illustrate ideal examples, and a mode of the present disclosure is not limited to the shapes, numerical values, or the like shown in the drawings.

Ordinal numerals "first", "second", "third", etc., in the specification are set not to form limits in number but only to avoid the confusion of composition elements.

In the specification, for convenience, expressions "central", "above", "below", "front", "back", "vertical", "horizontal", "top", "bottom", "inside", "outside", etc., indicating orientation or positional relationships are used to illustrate positional relationships between the composition elements referring to the drawings, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction where each composition element is described. Therefore, appropriate replacements based on situations are allowed, not limited to the expressions in the specification.

In the specification, unless otherwise specified and defined, terms "mounting", "mutual connection", and "connection" should be generally understood. For example, the term may be fixed connection, or detachable connection, or integral connection. The term may be mechanical connection or electric connection. The term may be direct connection, or indirect connection through an intermediate, or communication inside two elements. Those of ordinary skill in the art can understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that in the specification, a channel region refers to a main region that a current flows through.

In the specification, a first electrode may be the drain electrode, and a second electrode may be the source electrode. Alternatively, the first electrode may be a source electrode, and the second electrode may be a drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the specification.

In the specification, "electric connection" includes connection of the composition elements through an element with a certain electric action. "An element with a certain electric action" is not particularly limited as long as electric signals between the connected composition elements may be sent and received. Examples of "an element with a certain electric action" not only include an electrode and a line, but also include a switch element such as a transistor, a resistor, an inductor, a capacitor, another element with various functions, etc.

In the specification, "parallel" refers to a state that an angle formed by two straight lines is larger than −10° and smaller than 10°, and thus may also include a state that the angle is larger than −5° and smaller than 5°. In addition, "perpendicular" refers to a state that an angle formed by two straight lines is larger than 80° and smaller than 100°, and thus may also include a state that the angle is larger than 85° and smaller than 95°.

In the specification, "film" and "layer" may be exchanged. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values in process and measurement error ranges are allowed.

FIG. 1 is a schematic structural diagram of a display device. As shown in FIG. 1, an OLED display device may include a timing controller, a data signal driver, a scanning signal driver, a light-emitting signal driver, and a pixel array. The pixel array may include a plurality of scanning signal lines (S1 to Sm), a plurality of data lines (D1 to Dn), a plurality of light-emitting signal lines (E1 to Eo), and a plurality of sub-pixels (Pxij). In an exemplary implementation mode, the timing controller may provide a gray-scale value and a control signal suitable for a specification of the data signal driver to the data signal driver, may provide a clock signal, a scan starting signal, etc., suitable for a specification of the scanning signal driver to the scanning signal driver, and may provide a clock signal, an emission stopping signal, etc., suitable for a specification of the light-emitting signal driver to the light-emitting signal driver. The data signal driver may generate a data voltage to be provided to data lines D1, D2, D3, . . . to Dn using the gray-scale value and control signal received from the timing controller. For example, the data signal driver may sample the gray-scale value using the clock signal and apply the data voltage corresponding to the gray-scale value to the data lines D1 to Dn taking sub-pixel row as the unit, where n may be a natural number. The scanning signal driver may receive the clock signal, a scan starting signal, etc., from the timing controller to generate a scanning signal to be provided to the scanning lines S1, S2, S3, . . . to Sm. For example, the scanning signal driver may sequentially provide the scanning signal with an on-level pulse to the scanning signal lines S1 to Sm. For example, the scanning signal driver may be constructed in a form of a shift register and sequentially transmit the scan starting signal provided in form of an on-level pulse to a next-stage circuit to generate the scanning signal under the control of the clock signal, where m may be a natural number. The light-emitting signal driver may receive the clock signal, the emission stopping signal, etc., from the timing controller to generate an emission signal to be provided to the light-emitting signal lines E1, E2, E3, . . . to Eo. For example, the light-emitting signal driver may sequentially provide the emission signal with an off-level pulse to the light-emitting signal lines E1 to Eo. For example, the light-emitting signal driver may be constructed into a form of a shift register and can sequentially transmit a light-emitting stopping signal provided in form of an off-level pulse to a next-stage circuit to generate the light-emitting signal under the control of the clock signal, where "o" may be a natural number. The pixel array may include a plurality of sub-pixels Pxij. Each sub-pixel Pxij may be connected to a corresponding data line, a corresponding scanning signal line, and a corresponding light-emitting signal line, where i and j may be natural numbers. The sub-pixel Pxij may refer to a sub-pixel in which a transistor is connected to an ith scanning signal line as well as a jth data line.

Figure 2:
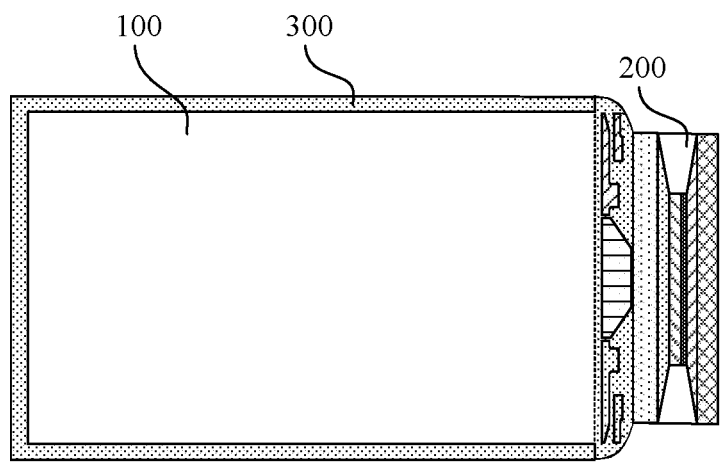
FIG. 2 is a schematic plan view of a display substrate.

FIG. 2 is a schematic plan view of a display substrate. As shown in FIG. 2, the display substrate may include a display region 100, a bonding region 200 on one side of the display region 100, and a border region 300 on other sides of the display region 100. The display region 100 may include a plurality of sub-pixels configured to display a dynamic picture or a static image. The bonding region 200 may include data fanout lines that connect a plurality of data lines to an integrated circuit. The border region 300 may include a power line for transmitting a power signal. The bonding region 200 and the border region 300 may include an isolating dam with a circular structure. At least one side of the border region 300 may be a crimping region formed by bending, or both the display region 100 and the border region 300 are bending or crimping regions. No limits are made thereto in the present disclosure.

Figure 3:
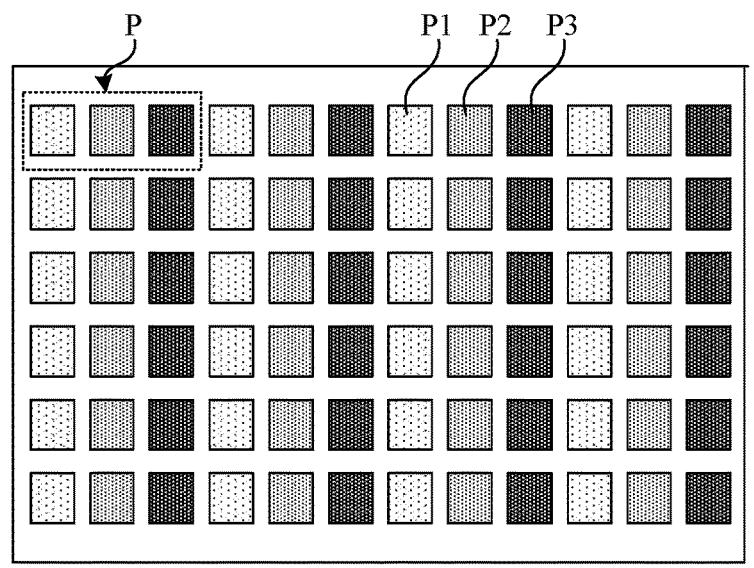
FIG. 3 is a schematic plan view of a display region in a display substrate.

In an exemplary implementation, the display region may include a plurality of pixel units arranged in array. FIG. 3 is a schematic plan view of a display region in a display substrate. As shown in FIG. 3, the display panel may include a plurality of pixel units P arranged in array. At least one of the plurality of pixel units P includes a first sub-pixel P1 that emits first-color light, a second sub-pixel P2 that emits second-color light, and a third sub-pixel P3 that emits third-color light. The first sub-pixel P1, the second sub-pixel P2, and the third sub-pixel P3 all include a pixel driving circuit and a light emitting device. The pixel driving circuit in each of the first sub-pixel P1, the second sub-pixel P2, and the third sub-pixel P3 is connected to a scanning signal line, a data line, and a light-emitting signal line. The pixel driving circuit is arranged to, under the control of the scanning signal line and the light-emitting signal line, receive a data voltage transmitted by the data line and output a corresponding current to the light emitting device. The light emitting device in each of the first sub-pixel P1, the second sub-pixel P2, and the third sub-pixel P3 is connected to the pixel driving circuit of the sub-pixel where it is located in. The light emitting device is arranged to, in response to the current output by the pixel driving circuit of the sub-pixel where it is located in, emit light with a corresponding brightness.

In an exemplary implementation, the pixel unit P may include a Red (R) sub-pixel, a Green (G) sub-pixel, and a Blue (B) sub-pixel, or may include a red sub-pixel, a green sub-pixel, a blue sub-pixel and a white sub-pixel, which is not limited in the present disclosure. In an exemplary implementation, a shape of the sub-pixel in the pixel unit may be a rectangle, a rhombus, a pentagon, or a hexagon. When the pixel unit includes three sub-pixels, the three sub-pixels may be arranged in parallel in a horizontal direction, in parallel in a vertical direction, or in a Delta shape. When the pixel unit includes four sub-pixels, the four sub-pixels may be arranged in parallel in the horizontal direction, in parallel in the vertical direction, or in a square. No limits are made thereto in the present disclosure.

Figure 4:
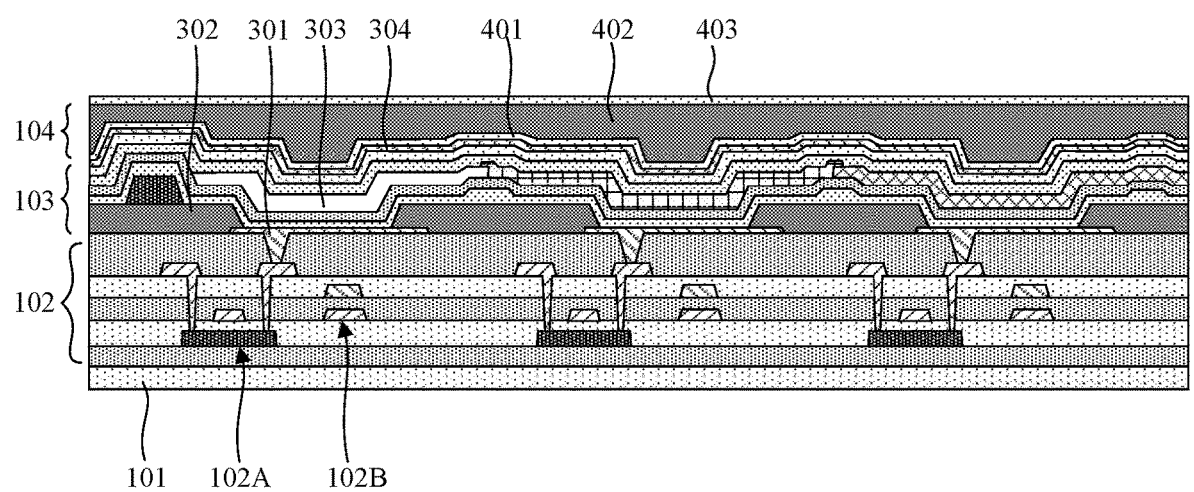
FIG. 4 is a schematic sectional view of a display region in a display substrate.

FIG. 4 is a schematic sectional view of a display region in a display substrate, illustrating structures of three sub-pixels of an OLED display substrate. As shown in FIG. 4, in a direction perpendicular to the display substrate, the display substrate may include a driving circuit layer 102 arranged on a substrate 101, a light emitting structure layer 103 arranged on a side, away from the substrate 101, of the driving circuit layer 102, and a encapsulation layer 104 arranged on a side, away from the substrate 101, of the light emitting structure layer 103. In some possible implementation modes, the display substrate may include other film layers, such as a post spacer, which is not limited in the preset disclosure.

In an exemplary implementation, the substrate 101 may be a flexible substrate, or a rigid substrate. The driving circuit layer 102 of each sub-pixel may include a plurality of transistors and memory capacitors that form a pixel driving circuit. In FIG. 4, only one transistor 102A and one memory capacitor 102B are taken as an example. The light emitting structure layer 103 may include an anode 301, a pixel define layer 302, an organic light emitting layer 303, and a cathode 304. The anode 301 is connected to a drain electrode of a drive transistor 210 through a via. The organic light emitting layer 303 is connected to the anode 301. The cathode 304 is connected to the organic light-emitting layer 303. The organic light-emitting layer 303 is driven by the anode 301 and the cathode 304 to emit light of a corresponding color. The encapsulation layer 104 may include a first encapsulation layer 401, a second encapsulation layer 402, and a third encapsulation layer 403 which are stacked. The first encapsulation layer 401 and the third encapsulation layer 403 may be made of an inorganic material. The second encapsulation layer 402 may be made of an organic material. The second encapsulation layer 402 is arranged between the first encapsulation layer 401 and the third encapsulation layer 403 so that it can be ensured that external water vapor cannot enter the light-emitting structure layer 103.

In an exemplary implementation mode, the organic light-emitting layer 303 may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary implementation, the hole injection layers of all the sub-pixels may be connected together to form a through layer; the electron injection layers of all the sub-pixels may be a connected together to form a through layer; the hole transport layers of all the sub-pixels may be connected together to form a through layer; the electron transport layers of all the sub-pixels may be connected together to form a through layer; the hole block layers of all the sub-pixels may be connected together to form a through layer; the light emitting layers of adjacent sub-pixels may be overlapped slightly, or may be isolated from each other; the electron block layers of the adjacent sub-pixels may be overlapped slightly, or may be isolated from each other.

Figure 5:
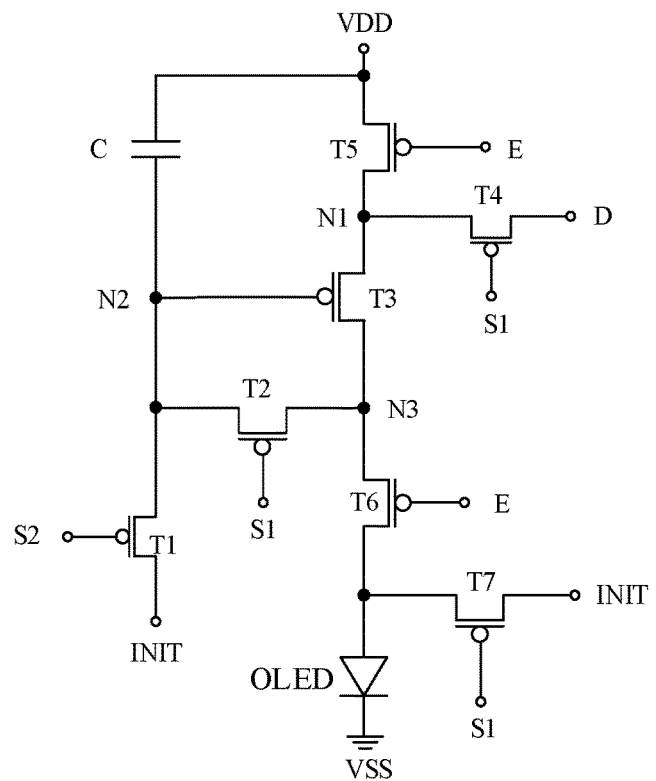
FIG. 5 is an equivalent circuit diagram of a pixel driving circuit.

In an exemplary implementation mode, the pixel driving circuit may have a structure of 3T1C, 4T1C, 5T1C, 5T2C, 6T1C, or 7T1C. FIG. 5 is an equivalent circuit diagram of a pixel driving circuit. As shown in FIG. 5, the pixel driving circuit may include seven transistors (a first transistor T1 to a seventh transistor T7), a memory capacitor C, and seven signal lines (a signal line D, a first scanning signal line S1, a second scanning signal line S2, a light emitting signal line E, an initial signal line INIT, a first power line VDD, and a second power line VSS).

In an exemplary implementation, a first terminal of the memory capacitor C is connected to the first power line VDD, and a second terminal of the memory capacitor C is connected to a second node N2, that is, the second terminal of the memory capacitor C is connected to a control electrode of a third transistor T3.

A control electrode of the first transistor T1 is connected to the second scanning signal line S2, a first electrode of the first transistor T1 is connected to the initial signal line INIT, and a second electrode of the first transistor is connected to the second node N2. When an on-level scanning signal is applied to the second scanning signal line S2, the first transistor T1 transmits an initial voltage to the control electrode of the third transistor T3 so as to initialize quantity of electric charge of the control electrode of the third transistor T3.

A control electrode of the second transistor T2 is connected to the first scanning signal line S1, a first electrode of the second transistor T2 is connected to the second node N2, and a second electrode of the second transistor T2 is connected to a third node N3. When the on-level scanning signal is applied to the first scanning signal line S 1, the second electrode of the third transistor T3 is connected to the control electrode of the third transistor T3 through the second transistor T2.

The control electrode of the third transistor T3 is connected to the second node N2, that is, the control electrode of the third transistor T3 is connected to the second terminal of the memory capacitor C. A first electrode of the third transistor T3 is connected to a first node N1, and a second electrode of the third transistor T3 is connected to the third node N3. The third transistor T3 may be referred to as a drive transistor. The third transistor T3 determines magnitude of a drive current flowing between the first power line VDD and the second power line VSS according to a potential difference between the control electrode and the first electrode of the third transistor T3.

A control electrode of the fourth transistor T4 is connected to the first scanning signal line S1, a first electrode of the fourth transistor T4 is connected to the data line D, and a second electrode of the fourth transistor T4 is connected to the first node N1. The fourth transistor T4 may be referred to as a switch transistor, or a scanning transistor. When the on-level scanning signal is applied to the first scanning signal line S1, the fourth transistor T4 drives a data voltage of the data line D to the pixel driving circuit.

A control electrode of the fifth transistor T5 is connected to the light emitting signal line E, a first electrode of the fifth transistor T5 is connected to the first power line VDD, and a second electrode of the fifth transistor T5 is connected to the first node N1. A control electrode of the sixth transistor T6 is connected to the light emitting signal line E, a first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When the on-level light emitting signal is applied to the light emitting signal line E, a driving current path is formed between the first power line VDD and the second power line VSS, the fifth transistor T5 and the sixth transistor T6 drive the light emitting device to emit light through the path.

A control electrode of the seventh transistor T7 is connected to the first scanning signal line S1, a first electrode of the seventh transistor T7 is connected to the initial signal line INIT, and a second electrode of the seventh transistor T7 is connected to the first electrode of the light emitting device. When the on-level scanning signal is applied to the first scanning signal line S1, the seventh transistor T7 transmits to an initial voltage to the first electrode of the light emitting device, so as to initialize the quantity of electric charge accumulated in the first electrode of the light emitting device or release the quantity of electric charge accumulated in the first electrode of the light emitting device.

In an exemplary implementation, a second electrode of the light emitting device is connected to the second power line VSS. A signal of the second power line VSS is a low-level signal. The first power line VDD keeps providing a high level. The first scanning signal line S1 is a scanning signal line in the pixel driving circuit of a present display row, and the second scanning signal line S2 is a scanning signal line in the pixel driving circuit of a previous display row. That is, for an $n^{th}$ display row, the first scanning signal line S1 is S(n), and the second scanning signal line S2 is S(n−1). The second scanning signal line S2 of the present display row and the first scanning signal line S1 in the pixel driving circuit of the previous display row are the same signal line. Thus signal lines of the display panel may be reduced, so as to achieve the display panel having narrow bezel.

In an exemplary implementation, the first transistor T1 to the seventh transistor T7 may be P-type transistors or N-type transistors. Adopting the same type of transistors in the pixel driving circuit may simplify a process flow, reduce process difficulties of a display panel, and improve the product yield. In some possible implementation modes, the first transistor T1 to the seventh transistor T7 may include P-type transistors and N-type transistors.

In an exemplary implementation, the first scanning signal line S 1, the second scanning signal line S2, the light emitting signal line E, and the initial signal line INIT extend horizontally, and the second power line VSS, the first power line VDD, and the data line D extend vertically.

In an exemplary implementation mode, the light emitting device may be an Organic Light-Emitting Diode (OLED), including a first electrode (anode), an organic light-emitting layer, and a second electrode (cathode) that are stacked.

Figure 6:
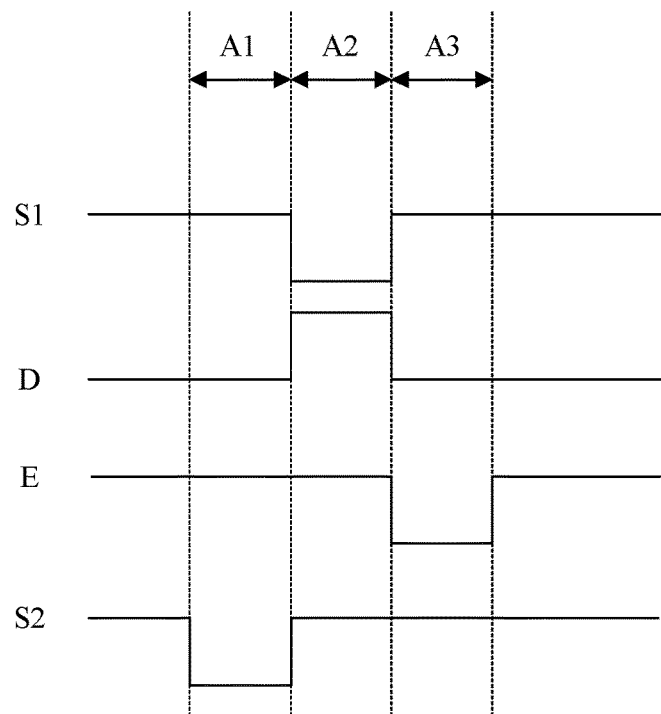
FIG. 6 is a work sequence diagram of a pixel driving circuit.

FIG. 6 is a work sequence diagram of a pixel driving circuit. The exemplary embodiment of the present disclosure will be described through a working process of the pixel driving circuit shown in FIG. 5. As shown in FIG. 5, the pixel driving circuit includes seven transistors (the first transistor T1 to the seventh transistor T7), a memory capacitor C, and seven signal lines (the data line D, the first scanning signal line S 1, the second scanning signal line S2, the light emitting signal line E, the initial signal line INIT, the first power line VDD, and the second power line VSS), and the seven transistors are all P-type transistors.

In an exemplary implementation, the working process of the pixel driving circuit may include the following operations.

In a first stage A1 that is called a reset stage, a signal of the second scanning signal line S2 is a low-level signal, and signals of the first scanning signal line S1 and the light emitting signal line E are high-level signals. The signal of the second scanning signal line S2 is a low-level signal, such that the first transistor T1 is switched on, a signal of the initial signal line INIT is provided to the second node N2 to initialize the memory capacitor C, thereby clearing an original data voltage in the memory capacitor. Signals of the first scanning signal line S1 and the light emitting signal line E are high-level signals, which allows the second transistor T2, the fourth transistor T4, the fifth transistor T5, the sixth transistor T6, and the seventh transistor T7 to be cut off. In this stage, the OLED does not emit light.

In a second stage A2 that is called a data writing stage or threshold compensating stage, a signal of the first scanning signal line S1 is a low-level signal, signals of the second scanning signal line S2 and the light emitting signal line E are high-level signals, and the data line D outputs a data voltage. In this stage, the second terminal of the memory capacitor C is of a low level, so that the third transistor T3 is switched on. The signal of the first scanning signal line S1 is a low-level signal, which allows the second transistor T2, the fourth transistor T4, and the seventh transistor T7 to be switched on. The second transistor T2 and the fourth transistor T4 are switched on so that the data voltage output by the data line D is provided to the second node N2 through the first node N1, the switched-on third transistor T3, the third node N3, and the switched-on second transistor T2, and a voltage difference between the data voltage output by the data line and a threshold voltage of the third transistor T3 is charged to the memory capacitor C, where a voltage at the second terminal (the second node N2) of the memory capacitor C is Vd−|Vth|, the data voltage output by the data line D is Vd, and the threshold voltage of the third transistor T3 is Vth. The seventh transistor T7 is switched on to provide an initial voltage of the initial signal line INIT to a first electrode of the OLED to initialize (reset) the first electrode of the OLED and clear its internal pre-stored voltage, thereby completing the initialization to ensure that the OLED does not emit light. The signal of the second scanning signal line S2 is a high-level signal, which allows the first transistor T1 to be cut off. The signal of the light emitting signal line E is a high-level signal, which allows the fifth transistor T5 and the sixth transistor T6 to be cut off.

In a third stage A3 that is called a light emitting stage, the signal of the light emitting signal line E is a low-level signal, and the signals of the first scanning signal line S1 and the second scanning signal line S2 are high-level signals. The signal of the light emitting signal line E is a low-level signal, which allows the fifth transistor T5 and the sixth transistor T6 to be switched on. A supply voltage output by the first power line VDD provides a drive voltage to the first electrode of the OLED through the switched-on fifth transistor T5, the third transistor T3, and the sixth transistor T6, thereby driving the OLED to emit light.

In a drive process of the pixel driving circuit, a drive current flowing through the third transistor T3 (the drive transistor) is determined by a voltage difference between its gate electrode and first electrode. A voltage at the second node N2 is Vdata−|Vth|, so that the drive current of the third transistor T3 is:

$$I=K*(Vgs-Vth)^2=K*[(Vdd-Vd+|Vth|)-Vth]^2=K*[(Vdd-Vd]^2,$$

where I is the drive current flowing through the third transistor T3, that is, the drive current for driving the OLED, K is a constant, Vgs is the voltage difference between the gate electrode and the first electrode of the third transistor T3, Vth is the threshold voltage of the third transistor T3, Vd is the data voltage output by the data line D, and Vdd is the supply voltage output by the first power line VDD.

Figure 7:
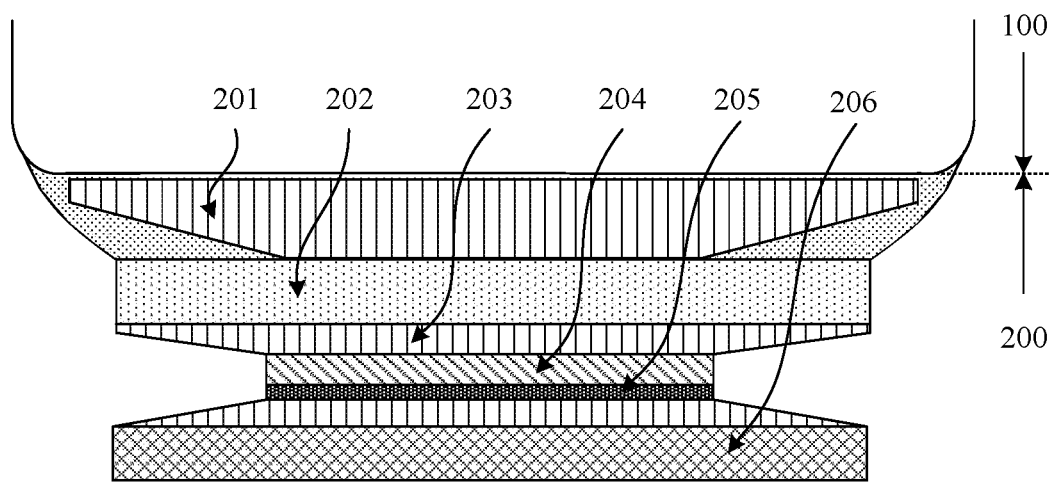
FIG. 7 is a schematic plan view of a bonding region in a display substrate.
Figure 8:
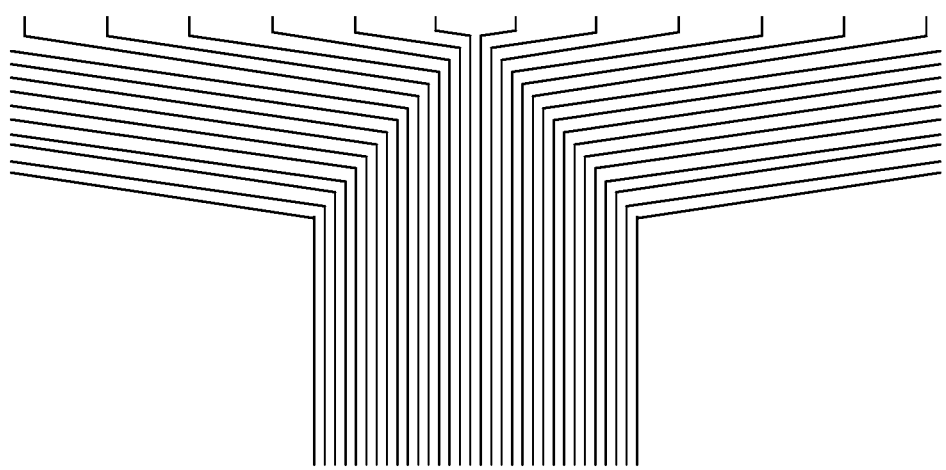
FIG. 8 is a schematic diagram of data fanout lines in a bonding region.

FIG. 7 is a schematic plan view of a bonding region in a display substrate. FIG. 8 is a schematic diagram of data fanout lines in a bonding region. As shown in FIG. 7, in a direction parallel to the display substrate, a bonding region 200 is located on one side of a display region 100. The bonding region 200 may include a first fanout area 201, a bending area 202, a second fanout area 203, an anti-static area 204, a driver chip area 205, and a bonding pin area 206 that are arranged in sequence along a direction away from the display region 100. The first fanout area 201 at least includes data fanout lines. A plurality of data fanout lines are arranged to be connected to Data Lines of the display region in a Fanout wiring manner, as shown in FIG. 8. The bending area 202 includes a composite insulating layer provided with a groove, and is arranged to bend the bonding region 200 to a back surface of the display region 100. The second fanout area 203 includes a plurality of data fanout lines that are led out in a fanout wiring manner. The anti-static area 204 includes an anti-static circuit, and is arranged for removing static electricity to prevent the display substrate from electrostatic damages. The driver chip area 205 includes an Integrated Circuit (IC for short) and is arranged to be connected to the plurality of data fanout lines. The bonding pin area 206 includes a Bonding Pad, and is arranged to be bonded to an external Flexible Printed Circuit (FPC for short).

With the development of OLED display technologies, consumers have higher requirements for the display effect of display products. Super-narrow bezels have become a new trend in the development of display products. Therefore, bezel narrowing or even a bezel-less design has received more attention in the design of OLED display products. At present, a left border, a right border, and an upper border of the display device may be controlled within 1.0 mm. However, the narrowing design of the lower border (a border on a side of the bonding region) is more difficult, and the lower border is always maintained at about 2.0 mm. This is because the data fanout lines are usually arranged in the fanout area of the bonding region, where the fanout area has large space occupation. Generally, a width of the bonding region is less than a width of the display region, the signal wires of the integrated circuit and the bonding pad in the bonding region are required to be led into the wider display region through the fanout area in a fanout manner, the great width difference between the display region and the bonding region causes the more oblique fanout lines in the fanout area, and causes the longer width distance between the driver chip area and the display region, which further causes the wider lower border, resulting in the lower border being much larger than the left and right borders.

An exemplary embodiment of the disclosure provides a display substrate. In an exemplary implementation mode, the display substrate includes a display region and a bonding region on a side of the display region; the bonding region at least includes a lead area; the display region includes a plurality of data lines and a plurality of data fanout lines, the lead area includes a plurality of lead wires, orthographic projections of the a plurality of data lines and the a plurality of data fanout lines on a plane of the display substrate are at least partially overlapped; a first end of at least one data fanout line is connected to the lead wire, and a second end thereof extends in a direction away from the lead area, to be connected to the data line.

In an exemplary implementation mode, the number of the data fanout lines is equal to the number of the data lines.

In an exemplary implementation mode, in a direction parallel to the display substrate, the display substrate has a first center line, and the first center line extends along a first direction and equally divides pixel columns of the display region, the first direction being parallel to the data lines; on one side of the first center line, the plurality of data lines include a first data line, a second data line, . . . , and an Nth data line that are arranged in sequence along a second direction or an opposite direction of the second direction, the second direction intersecting the first direction; the plurality of data fanout lines include a first data fanout line, a second data fanout line, . . . , and an Nth data fanout line that are arranged in sequence along the second direction or the opposite direction of the second direction; the plurality of lead wires include a first lead wire, a second lead wire, . . . , and an Nth lead wire that are arranged in sequence along the second direction or the opposite direction of the second direction; an orthographic projection of any one of the data fanout lines on the plane of the display substrate and orthographic projections of other data fanout lines on the plane of the display substrate have no overlap region; an orthographic projection of any one of the lead wires on the plane of the display substrate and orthographic projections of other lead wires on the plane of the display substrate have no overlap region; and N refers to the number of the data lines in the display region.

In an exemplary implementation mode, at least one data fanout line includes a first line segment and a second line segment; a first end of the first line segment is connected to the lead wire, and a second end of the first line segment extends along a second direction or an opposite direction of the second direction, to be connected to a first end of the second line segment; a second end of the second line segment extends in a direction away from the lead area, to be connected to the data line through a via; the second direction intersects the first direction, and the first direction is parallel to the data line.

In an exemplary implementation mode, in a plane parallel to the display substrate, the display substrate has a second center line, and the second center extends along the second direction and equally divides pixel rows of the display region; the via hole through which any one of the data fanout lines is connected to the data line has a distance L1 from the second center line, the distance L1 satisfying:

L1≤0.2*a length of the data line in the display region, where the length and the distance refer to dimensions in the first direction.

In an exemplary implementation mode, any one of the data fanout lines has an extension length L2 in the display region, the extension length L2 satisfying:

$$|L2i-L2j|/L2i\leq 0.2, \text{ or } |L2i-L2j|/L2j\leq 0.2,$$

where L2i is an extension length of one data fanout line in the display region, L2j is an extension length of another data fanout line in the display region, and the extension length of the data fanout line is the sum of an extension length of the first line segment and an extension length of the second line segment.

In an exemplary implementation mode, in a direction perpendicular to the display panel, the display substrate includes a first conductive layer, a second conductive layer, and a third conductive layer, and an insulating layer is arranged between the first conductive layer and the second conductive layer as well as between the second conductive layer and the third conductive layer; and the data lines and the data fanout lines are arranged in different conductive layers.

In an exemplary implementation mode, in the direction parallel to the display substrate, the display substrate includes a plurality of pixel islands, the pixel islands each including a plurality of sub-pixels; in the direction perpendicular to the display substrate, the sub-pixel includes a driving circuit layer arranged on a substrate and a light emitting structure layer arranged on a side, away from the substrate, of the driving circuit layer, the driving circuit layer including a pixel driving circuit, and the light emitting structure layer including a light emitting device connected to the pixel driving circuit.

At least one pixel island includes a circuit sub-area and a wiring sub-area, pixel driving circuits of the plurality of sub-pixels in the pixel island are arranged in the circuit sub-area, and the data fanout lines are arranged in the wiring sub-area.

In an exemplary implementation mode, an orthographic projection of at least one light emitting device in the pixel island on the plane of the display substrate and an orthographic projection of the data fanout line on the plane of the display substrate have an overlap region.

Figure 9:
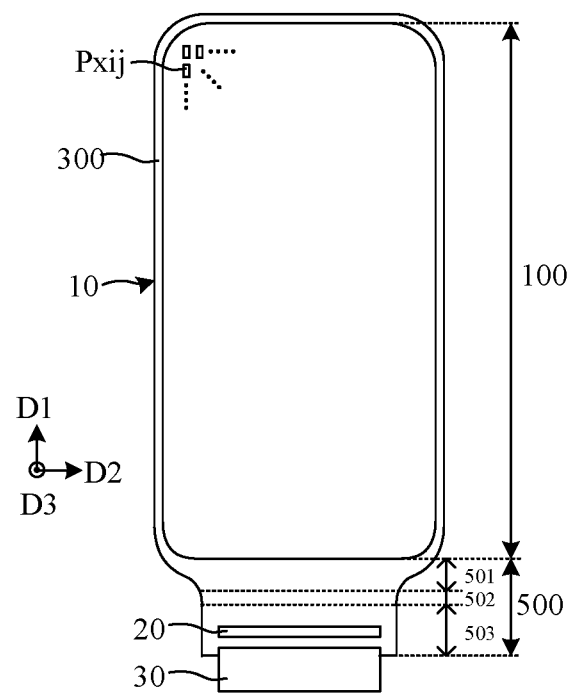
FIG. 9 is a schematic plan view of a display substrate according to an exemplary embodiment of the present disclosure.
Figure 10:
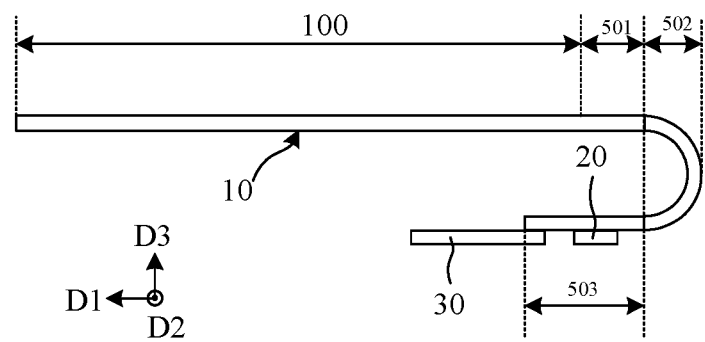
FIG. 10 is a side view of the display substrate in FIG. 9.

FIG. 9 is a schematic plan view of a display substrate according to an exemplary embodiment of the present disclosure. FIG. 10 is a side view of the display substrate in FIG. 9. As shown in FIG. 9 and FIG. 10, the display substrate 10 may include a display region 100, a bonding region 500 on one side, opposite to a first direction D1, of the display region 100, and a border region 300 on other sides of the display region 100. In an exemplary implement ion mode, the display region 100 may be a flatted region, including a plurality of sub-pixels Pxij forming a pixel array to display a dynamic picture or a static image. The display substrate may be a flexible substrate, and accordingly can be deformable, for example, can be crimped, bent, folded, or curled.

In an exemplary implementation, the bonding region 500 may include a lead area 501, a bending area 502, and a composite circuit area 503 that are arranged in sequence along an opposite direction (a direction away from the display region) of the first direction D1. The lead area 501 is connected to the display region 100, the bending area 502 is connected to the lead area 501, and the composite circuit area 503 is connected to the bending area 502.

In an exemplary implementation mode, the lead area 501 may be provided with a plurality of lead wires. One ends of the plurality of lead wires are correspondingly connected to the plurality of data lines in the display region 100, and the other ends are connected to an integrated circuit of the composite circuit area 503, so that the integrated circuit applies data signals to the data lines through the lead wires.

In an exemplary implementation, the bending area 502 may be bent with a curvature in a third direction D3, so that a surface of the composite circuit area 503 may be turned over, that is, the upper surface of the composite circuit area 503 may be turned to a surface facing downwards through the bending of the bending area 502, where the third direction D3 intersects the first direction D 1. In an exemplary implementation mode, when the bending area 502 is bent, the composite circuit area 503 may be overlapped with the display region 100 in the third direction D3 (a thickness direction).

In an exemplary implementation mode, the composite circuit area 503 may include an anti-static area, a driver chip area, and a bonding pin area. An Integrated Circuit (IC for short) 20 may be bonded to the driver chip area, and a Flexible Printed Circuit (FPC for short) 30 may be bonded to the bonding pin area. In an exemplary implementation, the integrated circuit 20 may generate a drive signal required for driving sub-pixels, and may provide a drive signal to the sub-pixels in the display region 100. For example, the drive signal may be a data signal that drives the luminance of the sub-pixels. In an exemplary implementation, the integrated circuit 20 may be bonded to the driver chip area by an anisotropic conductive film or other methods. A width of the integrated circuit 20 in a second direction D2 may be less than a width of the composite circuit area 503 in the second direction D2, where the second direction D2 intersects the first direction D1. In an exemplary implementation, the bonding pin area may be provided with a bonding pad containing a plurality of pins, and the flexible circuit board 30 may be bonded to the bonding pad.

In an exemplary implementation, the first direction D1 may be an extension direction (a column direction) of the data lines in the display region, the second direction D2 may be an extension direction (a row direction) of the scanning signal lines in the display region, the third direction D3 may be a direction perpendicular to the plane of the display substrate, the first direction D1 and the second direction D2 may be perpendicular to each other, and the first direction D1 and the third direction D3 may be perpendicular to each other.

Figure 11:
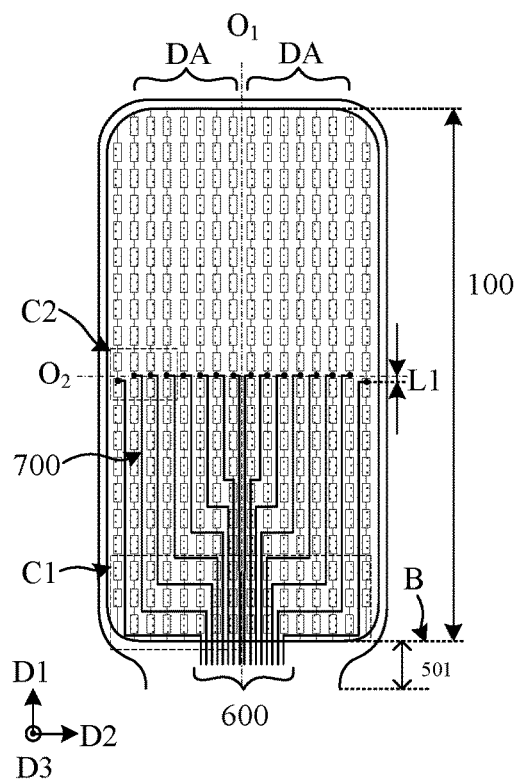
FIG. 11 is a schematic diagram of a structure of a type of lead wires and data fanout lines according to an exemplary embodiment of the present disclosure.

FIG. 11 is a schematic structural diagram of one type of lead wires and data fanout lines according to an exemplary embodiment of the present disclosure. As shown in FIG. 11, a display region 100 may include a plurality of sub-pixels, a plurality of data lines DA, and a plurality of data fanout lines 700. A lead area 501 of the bonding region may include a plurality of lead wires 600. In an exemplary implementation, the display region 100 may include a plurality of pixel units arranged in array such that a plurality of pixel rows and a plurality of pixel columns are formed. The plurality of data lines DA in the display region 100 extend along the first direction D1 or an opposite direction of the first direction D1, and are sequentially arranged at a set interval along the second direction D2, and each data line DA is connected to all sub-pixels of a pixel column in the display region 100. The plurality of lead wires 600 of the lead area 501 are sequentially arranged at a set interval along the second direction D2, first ends of the plurality of lead wires 600 are located at an edge B of the display region, and second ends of the plurality of lead wires 600 extend to the bending area in a direction away from the display region. First ends of the plurality of data fanout lines 700 in the display region 100 are located at the edge B of the display region, and are correspondingly connected to the first ends of the plurality of lead wires 600. Second ends of the plurality of data fanout lines 700 extend in a direction away from the lead area, and are correspondingly connected to the plurality of data lines DA. In an exemplary implementation, the edge B of the display region may be an edge on a side, close to the lead area 501, of the display region 100.

In an exemplary implementation mode, the number of the data lines, the number of data fanout lines, and the number of the lead wires are the same.

In an exemplary implementation mode, a plurality of lead wires may be arranged to be parallel to the first direction D1, that is, the lead wires are parallel to the data lines.

In an exemplary implementation, the plurality of lead wires have the same width, adjacent lead wires have the same spacing, and the spacing between the adjacent lead wires is less than the spacing between the adjacent data lines.

In an exemplary implementation, the display substrate has a first center line $O_1$, and the first center line $O_1$ extends along the first direction D1 and equally divides the plurality of pixel columns of the display region 100. The plurality of data lines DA, the plurality of data fanout lines 700, and the plurality of lead wires 600 may be symmetrically arranged relative to the first center line $O_1$. The display region 100 has a second center line $O_2$, and the second center line $O_2$ extends along the second direction D2 and equally divides the plurality of pixel rows of the display region 100. The plurality of sub-pixel rows in the display region 100 may be symmetrically arranged relative to the second center line $O_2$. N data lines, N data fanout lines, and N lead wires contained in the left side of the display substrate are taken as an example for description below, where N is a positive integer greater than 2.

In an exemplary implementation mode, the N data lines may include a first data line DA1, a second data line DA2, . . . , and an Nth data line that are arranged in sequence along the second direction D2; the N data fanout lines may include a first data fanout line 701, a second data fanout line 702, ..., and an Nth data fanout line 70N; the N lead wires may include a first lead wire 601, a second lead wire 602, ..., and an Nth lead wire 60N that are arranged in sequence along the second direction D2 or the opposite direction of the second direction D2.

In an exemplary implementation, the N lead wires may be correspondingly connected to the N data fanout lines, and the N data fanout lines may be correspondingly connected to the N data lines, so that the lead wires provide data signals to the data lines through the data fan outlet lines.

In an exemplary implementation mode, a first end of an ith data fanout line may be connected to an ith lead wire at the edge B of the display region, and a second end of the ith data fanout line extends in a direction away from the lead area to a position near the second center line $O_2$ of the display region 100, to be connected to an ith data line, where i=1, 2, ..., N.

In an exemplary implementation, the second end of the data fanout line is connected to the data line through a via, that is, the via is positioned at the second end of the data fanout line. The second end (the via) of any one of the data fanout lines 700 has a distance L1 from the second center line, the distance L1 may satisfy: L1≤0.2×a length of the data line in the display region, where the length and the distance L1 of the data line refer to dimensions in the first direction D1.

In an exemplary implementation, the second end of any one of the data fanout lines may be connected to the data line at the position where the second center line $O_2$ locates, that is, each via hole is located on the second center line $O_2$.

In an exemplary implementation, the ith data fanout line may include a first line segment and a second line segment. A first end of the first line segment is located at the edge B of the display region and connected to an ith lead wire. A second end of the first line segment extends along the opposite direction of the second direction D2, to be connected to a first end of the second line segment. A second end of the second line segment extends to a position near the second center line $O_2$ along the first direction D1, to be connected to the ith data line.

In an exemplary implementation, the first line segment may include a lead-out segment and a first extension segment. A first end of the lead-out segment is located at the edge B of the display region, and connected to the ith lead wire. A second end of the lead-out segment extends along the first direction D1, to be connected to a first end of the first extension segment. A spacing between adjacent lead-out segments may be less than a spacing between adjacent data lines. A second end of the first extension segment extends to a position between an ith pixel column and an (i+1)th pixel column along the opposite direction of the second direction D2, to be connected to a first end of the second line segment.

In an exemplary implementation, the second line segment may include a second extension segment and a connecting segment. A first end of the second extension segment is connected to a second end of the first line segment, and a second end of the second extension segment extends to a position near the second center line $O_2$ along the first direction D1, to be connected to a first end of the connecting segment. A second end of the connecting segment extends along the opposite direction of the second direction D2, to be connected to the ith data line.

In an exemplary implementation, an extension length of the first line segment may be 0, that is, the ith data fanout line may only include the second line segment.

In an exemplary implementation, a plurality of line segments of a kth data fanout line may form a bent line extending to the second center line $O_2$, a distance from a first extension segment of the kth data fanout line to the second center line $O_2$ may be greater than a distance from a first extension segment of a (k+1)th data fanout line to the second center line $O_2$, and a distance from a second extension segment of the kth data fanout line to the first center line $O_1$ may be greater than a distance from a second extension segment of the (k+1)th data fanout line to the first center line $O_1$, where k=1, ..., and N−1.

Figure 12:
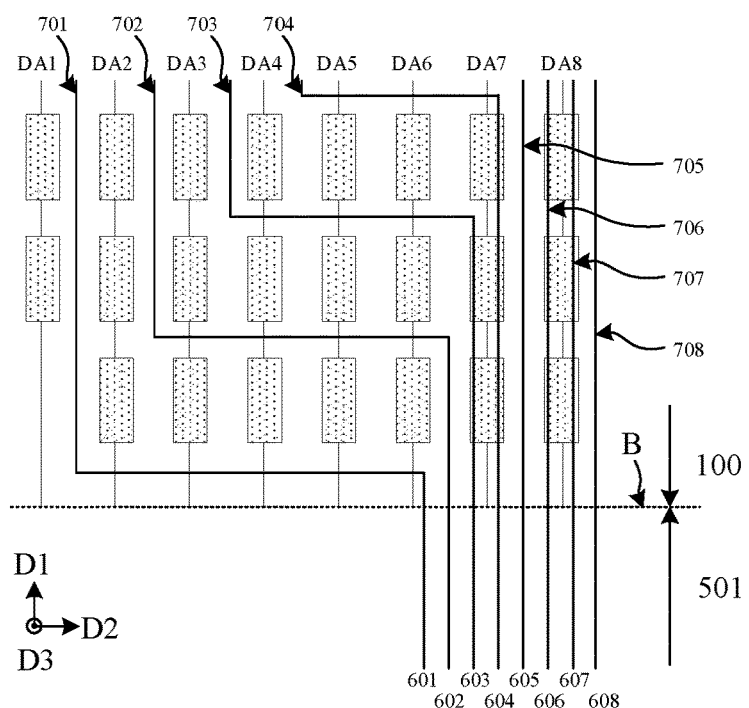
FIG. 12 is an enlarged view of region C1 in FIG. 11.

FIG. 12 is an enlarged view of region C1 in FIG. 11, illustrating an arrangement structure of lead wires and data fanout lines when N=8. As shown in FIG. 12, eight data lines may include a first data line DA1, a second data line DA2, a third data line DA3, a fourth data line DA4, a fifth data line DA5, a sixth data line DA6, a seventh data line DA7, and an eighth data line DA8 that are sequentially arranged along the second direction D2; the eight lead wires of the lead area 501 of the bonding region may include a first lead wire 601, a second lead wire 602, a third lead wire 603, a fourth lead wire 604, a fifth lead wire 605, a sixth lead wire 606, a seventh lead wire 607, and an eighth lead wire 608 that are sequentially arranged along the second direction D2.

In an exemplary implementation, a first end of an ith data fanout line is connected to an ith lead wire near the edge B of the display region, and a second end of the ith data fanout line extends to be close to the second center $O_2$ in the display region 100 in form of a bent line, to be connected to an ith data line, where i=1, 2, ..., and 8.

In an exemplary implementation, a first extension segment of the ith data fanout line and a first extension segment of an (i+1)th data fanout line may be located between different pixel columns. For example, the first extension segment of the first data fanout line is located on a side, close to the lead area, of the last pixel row, and the first extension segment of the second data fanout line may be located between the last pixel row and the second last pixel row.

In an exemplary implementation mode, the second extension segment of the ith data fanout line and the second extension segment of the (i+1)th data fanout line are located between different pixel columns. For example, the second extension segment of the first data fanout line is located between the first pixel column and the second pixel column, and the second extension segment of the second data fanout line is located between the second pixel column and the third pixel column.

Though the second extension segment and the connecting segment of the data fanout line being located on the right side of the corresponding data line are taken as an example for description in the exemplary embodiment shown in FIG. 12, in the present disclosure, the second extension segment and the connecting segment of the data fanout line may be located on the left side of the corresponding data line. No limits are made in the present disclosure.

Figure 13:
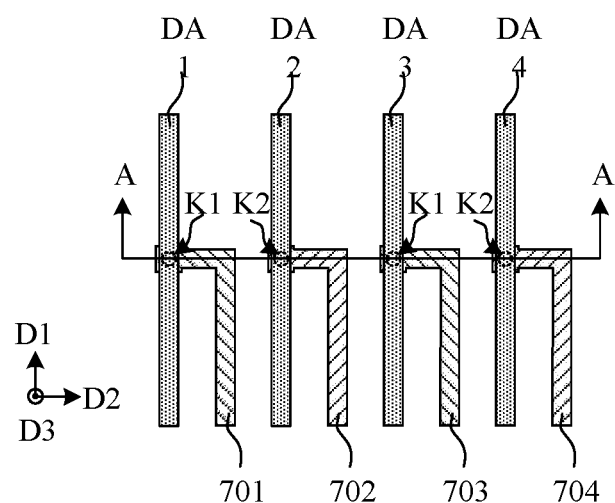
FIG. 13 is an enlarged view of region C2 in FIG. 11.
Figure 14:
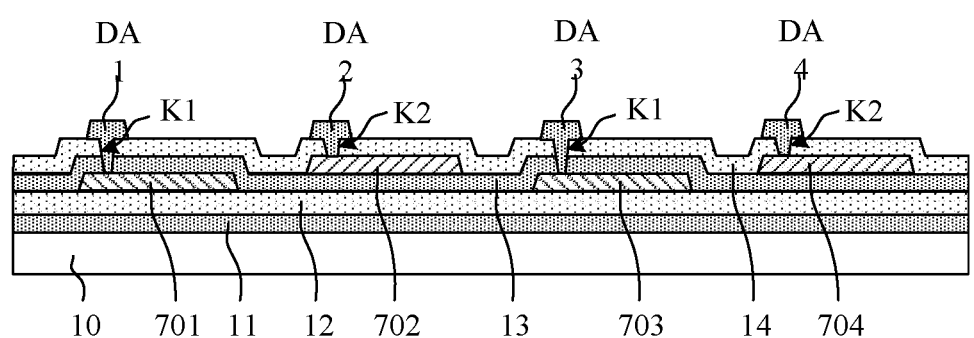
FIG. 14 is a sectional view in direction A-A in FIG. 13.

FIG. 13 is an enlarged view of region C2 in FIG. 11, and FIG. 14 is a sectional view in direction A-A in FIG. 13. As shown in FIG. 13, second extension segments of the first data fanout line 701, the second data fanout line 702, the third data fanout line 703, and the fourth data fanout line 704 extend along the first direction D1, to be respectively connected to first ends of the corresponding connecting segments; second ends of the connecting segments extend in the opposite direction of the second direction D2, to be correspondingly connected to the first data line DA1, the second data line DA2, the third data line DA3, and the fourth data line DA4 through vias.

In an exemplary implementation mode, the data lines and the data fanout lines may be arranged in different film layers, and an insulating layer may be arranged between the data lines and the data fanout lines.

In an exemplary implementation mode, the lead wires and the data fanout lines may be arranged in the same film layers and formed simultaneously by a same patterning process, and the lead wires and the data fanout lines may be of an integrated structure connected to each other.

In an exemplary implementation mode, the lead wires and the data fanout lines may be arranged in different film layers, an insulating layer may be arranged between the two, and the two are connected through vias.

In an exemplary implementation mode, the data lines may include data lines in odd columns and data lines in even columns, the data lines in odd columns are arranged in an odd sub-pixel array, and the data lines in even columns are arranged in an even sub-pixel array. Correspondingly, the data fanout lines may include odd data fanout lines and even data fanout lines, the data fanout lines that are connected to the data lines in odd columns are called odd data fanout lines, and the data fanout lines that are connected to the data lines in even columns are called even data fanout lines. Correspondingly, the lead wires may include odd lead wires and even lead wires, the lead wires that are connected to the data lines in the odd columns through the odd data fanout lines are called odd lead wires, and the lead wires that are connected to the data lines in the even columns through the even data fanout lines are called even lead wires.

In an exemplary implementation mode, the odd data fanout lines and the even data fanout lines may be arranged in the same film layer. Alternatively, the odd data fanout lines and the even data fanout lines may be arranged in different film layers, an insulating layer is arranged between the odd data fanout lines and the even data fanout lines, that is, an insulating layer is arranged between the data lines and the odd data fanout lines, an insulating layer is arranged between the data lines and the even data fanout lines, and an insulating layer is arranged between the odd data fanout lines and the even data fanout lines.

In an exemplary implementation, the odd lead wires and the odd data fanout lines may be arranged in the same layer and formed simultaneously by a same patterning process, and the odd lead wires and the odd data fanout lines may be of an integrated structure connected to each other. The even lead wires and the even data fanout lines may be arranged in the same layer and formed simultaneously by a same patterning process. The even lead wires and the even data fanout lines may be of an integrated structure connected to each other.

As shown in FIG. 14, in a direction perpendicular to the display substrate, the display substrate may include a plurality of conductive layers arranged on a substrate, and the plurality of conductive layers may include a first conductive layer, a second conductive layer, and a third conductive layer that are sequentially arranged along a direction away from the substrate. The first conductive layer may include odd data fanout lines and odd lead wires, the second conductive layer may include even data fanout lines and even lead wires, and the third conductive layer may include data lines.

In an exemplary implementation, in the direction perpendicular to the display substrate, the display substrate may include a semiconductor layer and a plurality of insulating layers, and the plurality of insulating layers may include a first insulating layer 11, a second insulating layer 12, a third insulating layer 13, and a fourth insulating layer 14 that are sequentially arranged along a direction away from the substrate. In an exemplary implementation, the first insulating layer 11 is arranged on the substrate 10, the semiconductor layer is arranged on a side, away from the substrate, of the first insulating layer 11; the second insulating layer 12 covers the semiconductor layer; the first conductive layer is arranged on a side, away from the substrate, of the second insulating layer 12; the third insulating layer 13 covers the first conductive layer; the second conductive layer is arranged on a side, away from the substrate, of the third insulating layer 13; the fourth insulating layer 14 covers the second conductive layer; and the third conductive layer is arranged on a side, away from the substrate, of the fourth insulating layer 14.

In an exemplary implementation, an orthographic projection of any one of the lead wires on the substrate and orthographic projections of other lead wires on the substrate have no overlap region, and an orthographic projection of any one of the data fanout lines on the substrate and orthographic projections of other data fanout lines on the substrate have no overlap region.

In an exemplary implementation, the first insulating layer, the second insulating layer, the third insulating layer, and the fourth insulating layer may be made of any one or more of silicon oxide (SiOx), silicon nitride (SiNx), and silicon oxynitride (SiON), and may be single-layer, multilayer, or composite. The first insulating layer may be called a Buffer layer and arranged to prevent ionic impurity diffusion, prevent moisture permeation, and execute a surface planarization function. The second insulating layer arranged between the semiconductor layer and the first conductive layer and the third insulating layer arranged between the first conductive layer and the second conductive layer may be called Gate Insulator (GI) layers. The fourth insulating layer arranged between the second conductive layer and the third conductive layer may be called an Interlayer Dielectric (ILD) layer. The first conductive layer, the second conductive layer, and the third conductive layer may be made of a metal material, for example, any one or more of Argentum (Ag), Copper (Cu), Aluminum (Al), Titanium (Ti), and Molybdenum (Mo), or an alloy material of the abovementioned metals, for example, an Aluminum-Neodymium alloy (AlNd) or a Molybdenum-Niobium alloy (MoNb), and may be a single-layer structure, or a multilayer composite structure such as Ti/Al/Ti. The semiconductor layer may be made of amorphous Indium Gallium Zinc Oxide (a-IGZO), zinc oxynitride (ZnON), indium zinc tin oxide (IZTO), amorphous silicon (a-Si), polysilicon (p-Si), sexithiophene, polythiophene, or other materials. That is, the present disclosure is applied to a transistor manufactured based on an oxide technology, a silicon technology, or an organic matter technology. An active layer based on the oxide technology may use an oxide containing indium and tin, an oxide containing tungsten and indium, an oxide containing tungsten and indium and zinc, an oxide containing titanium and indium, and an oxide containing titanium and indium and tin, an oxide containing indium and zinc, an oxide containing silicon, indium and tin, an oxide containing indium, gallium and zinc, and the like.

In an exemplary implementation mode, in the display region, the semiconductor layer may include active layers of a plurality of transistors, and the first conductive layer may include scanning signal lines, gate electrodes of the plurality of transistors, first capacitor plates, odd lead wires, and odd data fanout lines; the second conductive layer may include second capacitor plates, even lead wires, and even data fanout lines; and the third conductive layer may include data lines, and source and drain electrodes of the plurality of transistors. In the bonding region, the first conductive layer may include odd lead wires, the second conductive layer may include even lead wires, and the third conductive layer may include data lines.

In an exemplary implementation, the third insulating layer 13 and the fourth insulating layer 14 may be provided with a plurality of first vias K1, the plurality of first vias K1 are located at end portions of the odd data fanout lines, and portions of the third insulating layer 13 and the fourth insulating layer 14 in the first vias K1 are etched, so that surfaces of the odd data fanout lines are exposed. The first vias K1 are arranged such that the data lines in odd columns formed subsequently are connected to the odd data fanout lines through the vias.

In an exemplary implementation mode, the fourth insulating layer 14 may be provided with a plurality of second vias K2, the plurality of second vias K2 are located at end portions of the even data fanout lines, and portions of the fourth insulating layer 14 in the second vias K2 are etched, so that surfaces of the even data fanout lines are exposed. The second vias K2 are arranged such that the data lines in even columns formed subsequently are correspondingly connected to the even data fanout lines through the vias.

A preparation process of the display substrate will be exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for the organic material. Deposition may be any one or more of sputtering, evaporation, and chemical vapor deposition. Coating may be any one or more of spray coating, spin coating, and ink-jet printing. Etching may be any one or more of dry etching and wet etching. No limits are made in the present disclosure. "Thin film" refers to a thin film layer prepared from a certain material on a substrate by a process such as depositing, coating, or the like. If the patterning process on the "thin film" is omitted in the entire preparation process, the "thin film" may be called "layer". If the patterning process on the "thin film" is required in the entire preparation process, it is called "thin film" before the patterning process, and called "layer" after the patterning process. The "layer" obtained after the patterning process includes at least one "pattern". In the present disclosure, "A and B are arranged in the same layer" means that A and B are formed simultaneously through a same patterning process, where a "thickness" of the film layer is a dimension of the film layer in a direction perpendicular to the display substrate. In the embodiment of the present disclosure, "an orthographic projection of A includes an orthographic projection of B" or "an orthographic projection of B is within a range of an orthographic projection of A" means an edge of a display region of the orthographic projection of B falls within an edge range of a display region of the orthographic projection of A, or an edge of a display region of the orthographic projection of A and an edge of a display region of the orthographic projection of B are overlapped with each other.

In an exemplary implementation mode, the preparation process of the display substrate may include the following operations.

(1) A semiconductor layer pattern is formed on the substrate. In an exemplary implementation, the operation that a semiconductor layer pattern is formed on the substrate may include: a first insulating thin film and a semiconductor thin film are sequentially deposited on the substrate, the semiconductor thin film is patterned through the patterning process to form a first insulating layer that covers the whole substrate and form the semiconductor layer pattern arranged on the first insulating layer, where the semiconductor layer pattern at least includes active layers of the plurality of transistors. In an exemplary implementation mode, the substrate may be a flexible substrate.

(2) A first conductive layer pattern is formed. In an exemplary implementation, the operation that a first conductive layer is formed may include: a second insulating thin film and a first metal thin film are sequentially deposited on the substrate on which the above-mentioned pattern is formed, and the first metal thin film is patterned through the patterning process to form a second insulating layer that covers the semiconductor layer pattern and form a first conductive layer pattern arranged on the second insulating layer, where the first conductive layer pattern includes at least a plurality of odd data fanout lines, a plurality of scanning signal lines, and gate electrodes of a plurality of transistor, and a plurality of first capacitor electrodes that are located in the display region, and a plurality of odd lead wires that are located in the lead area of the bonding region, and the odd data fanout lines and the odd lead wires may be of an integrated structure connected to each other.

(3) A second conductive layer pattern is formed. In an exemplary implementation, the operation that the second conductive layer pattern is formed may include: a third insulating thin film and a second metal thin film are sequentially deposited on the substrate on which the above-mentioned pattern is formed, the second metal film is patterned through the patterning process to form a third insulating layer that covers the first conductive layer pattern, and form a second conductive layer pattern arranged on the third insulating layer, where the second conductive layer pattern at least includes a plurality of even data fanout lines and a plurality of second capacitor electrodes that are located in the display region, and a plurality of even lead wires located in the lead area of the bonding region, and the even data fanout lines and the even lead wires may be of an integrated structure connected to each other.

(4) A fourth insulating layer pattern is formed. In an exemplary implementation, the operation that a fourth insulating thin film is formed may include: a fourth insulating thin film is deposited on the substrate on which the above-mentioned pattern is formed, the fourth insulating thin film is patterned through the patterning process to form a fourth insulating layer that covers the second conductive layer pattern, where the fourth insulating layer is provided with a plurality of vias, the plurality of vias may include active vias at positions of a plurality of active layers in the display region, and a plurality of first vias and second vias that are located at end portions of the data fanout lines in the display region. The active layers are exposed from the active vias, the odd data fanout lines are exposed from the first vias, and the even data fanout lines are exposed from the second vias.

(5) A third conductive layer pattern is formed. In an exemplary implementation, the operation that a third conductive layer pattern is formed may include: a third metal thin film is deposited on the substrate on which the above-mentioned pattern is formed, the third metal thin film is patterned through the patterning process to form a third conductive layer pattern on the fourth insulating layer, where the third conductive layer pattern at least includes: a plurality of data lines and sources electrodes and drain electrodes of a plurality of transistors, the source electrodes and the drain electrodes are respectively connected to the corresponding active layers through the active vias, the data lines in odd columns are connected to the odd data fanout lines through the first vias, and the data lines in even columns are connected to the even data fanout lines through the second vias.

In an exemplary implementation, the preparation of the display substrate may further include forming of a light emitting structure layer and a encapsulation layer, and the like, which will not be elaborated here.

In an exemplary implementation mode, the first conductive layer and the second conductive layer may be made of the same metal material, for example, Molybdenum (Mo), each data fanout line have the same width with the lead wires, the adjacent lead wires have the same spacing, and the width and the spacing are both dimensions in the second direction D2.

Although the foregoing exemplary embodiments have been described by taking the odd data fanout lines arranged on the first conductive layer, the even data fanout lines arranged on the second conductive layer, and the data lines arranged on the third conductive layer as an example for description, in the present disclosure, the odd data fanout lines, even data fanout lines, and data lines can be arranged in any layer, as long as it is ensured that the data lines and data fanout lines are located in the different conductive layers. No limits are made thereto in the present disclosure.

The structure of the display substrate and its preparation process in the present disclosure are only exemplary description. In an exemplary implementation, variation of corresponding structures and addition or reduction of the patterning process may be performed as practically required, which is not limited in the present disclosure.

In a display substrate, the bonding region is provided with a fanout area, and the data lines of the display region are led out through the data fanout lines of the fanout area. More oblique lines in the fanout area result in the wider lower border, which is not conducive to implementation of a narrow bezel. In an exemplary embodiment of the present disclosure, lead wires are arranged in the lead area of the bonding region, and are connected to the corresponding data lines through the data fanout lines arranged in the display region, so that corresponding connection between the plurality of lead wires and the a plurality of data lines is implemented, and the oblique lines forming a fan shape are omitted from the lead area. The plurality of lead wires are vertical lines parallel to each other, which can be directly led into the composite circuit area of the bonding area, effectively reducing the length of the lead area in a vertical direction effectively, greatly reducing the width of the lower border, allowing the widths of the upper boarder, the lower border, the left border, and the right border of the display device to be similar and all below 1.0 mm, increasing a screen-to-body ratio, and facilitating the implementation of a bezel-less display.

In the exemplary embodiment of the present disclosure, the data fanout lines and the data lines are arranged to be connected near the second center line of the display region such that resistance drop (IR Drop) of the data lines is effectively reduced, more uniform screen displaying can be achieved, and display quality is improved. In a display substrate, data lines are usually connected to data fanout lines at an edge of the display region, so that voltage drop of data signals output from the data lines to different sub-pixels is different; especially for a display device with high resolution or larger size, the resistance drop difference between the sub-pixels in a first pixel row and the sub-pixels in a last pixel row is large, causing problems such as uneven display images. In the present disclosure, the data fanout lines are arranged in the display region, and are connected to the data lines through vias at the middle position of each column of sub-pixels, thereby effectively narrowing the lower border, and also effectively reducing the resistance drop of transmitted data, achieving more uniform screen displaying, and improving display quality.

Figure 15:
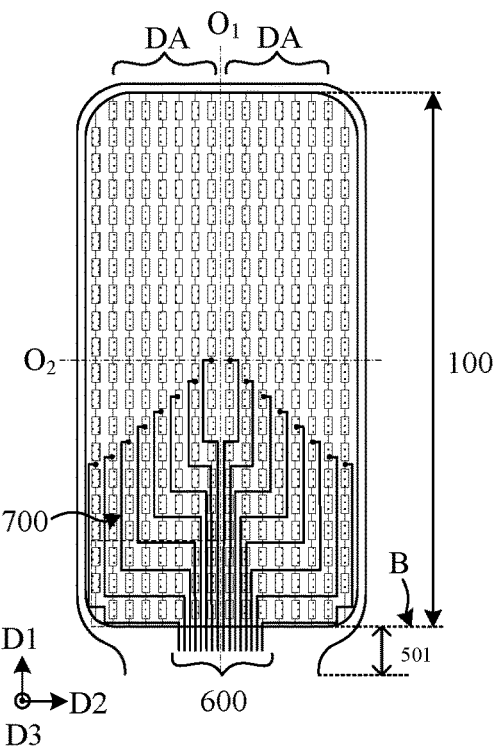
FIG. 15 is schematic diagram of a structure of another type of lead wires and data fanout lines according to an exemplary embodiment of the present disclosure.

FIG. 15 is schematic diagram of a structure of another type of lead wires and data fanout lines according to an exemplary embodiment of the present disclosure. As shown in FIG. 15, a plurality of data lines and a plurality of data fanout lines in a display region 100, and a plurality of lead wires 600 in a lead area 501 of the bonding region may be symmetrically arranged relative to a first center line $O_1$.

In an exemplary implementation, the structure of the plurality of data lines DA and the plurality of lead wires 600 may be similar to that in the foregoing exemplary embodiment, and will not be repeated here.

In an exemplary implementation mode, eight lead wires may be correspondingly connected to eight data fanout lines, and eight data fanout lines may be correspondingly connected to eight data lines, so that the lead wires provide data signals to the data lines through the data fanout lines.

In an exemplary implementation, any one of the data fanout lines has an extension length L2 in the display region 100, and the extension length L2 may satisfy:

$$|L2i-L2j|/L2i \leq 0.2, \text{ or } |L2i-L2j|/L2j \leq 0.2,$$

where L2i is an extension length of one data fanout line in the display region, and L2j is an extension length of another data fanout line in the display region.

In an exemplary implementation mode, for the bent-line-shaped data fanout line, the extension length of the data fanout line may be the sum of the various line segments that make up the data fanout line.

That the left side of the display substrate contains eight (i.e., N=8) data lines DA, eight data fanout lines 700, and eight lead wires 600 is taken as an example for description below.

In an exemplary implementation, an ith data fanout line may include a first line segment and a second line segment. A first end of the first line segment is located at the edge B of the display region and connected to an ith lead wire. A second end of the first line segment extends along the opposite direction of the second direction D2, to be connected to a first end of the second line segment. A second end of the second line segment extends along a first direction D1, to be connected to the ith data line, where i=1, 2, . . . , and 8.

In an exemplary implementation mode, the first line segment may include a lead-out segment and a first extension segment. A first end of the lead-out segment is located at the edge B of the display region, and connected to the ith lead wire. A second end of the lead-out segment extends along the first direction D1, to be connected to a first end of the first extension segment. A second end of the first extension segment extends along the opposite direction of the second direction D2, to be connected to a first end of the second line segment.

In an exemplary implementation, the second line segment may include a second extension segment and a connecting segment. A first end of the second extension segment is connected to the second end of the first line segment, and a second end of the second extension segment extends along the first direction D1, to be connected to a first end of the connecting segment. A second end of the connecting segment extends along the opposite direction of the second direction D2, to be connected to the ith data line.

In an exemplary implementation, the extension length L2i of the ith data fanout line is equal to the sum of the extension length of the lead-out segment along the first direction D1, the extension length of the first extension segment along the opposite direction of the second direction D2, the extension length of the second extension segment along the first direction D1, and the extension length of the connecting segment along the opposite direction of the second direction D2.

In an exemplary implementation, an orthographic projection of any one of the lead wires on the substrate and orthographic projections of other lead wires on the substrate have no overlap region, and an orthographic projection of any one of the data fanout lines on the substrate and orthographic projections of other data fanout lines on the substrate have no overlap region.

In the exemplary embodiment, the film layer structure of the data lines, the data fanout lines, and the lead wires may be similar to that in the foregoing exemplary embodiment, and will not be repeated here.

According to the exemplary embodiment of the present disclosure, the technical effects of the foregoing embodiments can be achieved, including effectively narrowing the lower border, effectively avoiding size deviation of two film layers, and effectively improving display uniformity and display quality. When the extension lengths of different data fanout lines have a great difference, different data fanout lines will have a great resistance difference. This resistance difference may cause display problems, such as a color difference between the two sides and the middle color, and flickering picture pinking. In the present disclosure, the extension lengths of the data fanout lines are substantially similar such that resistances of the data fanout lines are substantially similar, and the difference of the resistance drops of the plurality of data fanout lines is small, thereby realizing more uniform screen displaying and improving display quality.

Although the foregoing exemplary embodiment has described that the plurality of lead wires are arranged in order of increasing numbers along the second direction D2, in the present disclosure, the plurality of lead wires may be arranged in other manners. For example, the plurality of lead wires may be arranged in order of decreasing numbers along the second direction D2. For another example, the plurality of lead wires can be divided into at least two lead groups, one lead group can be arranged along the opposite direction of the second direction D2 in order of increasing numbers, and the other lead group can be arranged along the second direction D2 in order of increasing numbers, and the lead wires in the two lead groups are alternately arranged. No limits are made thereto in the present disclosure.

Figure 16:
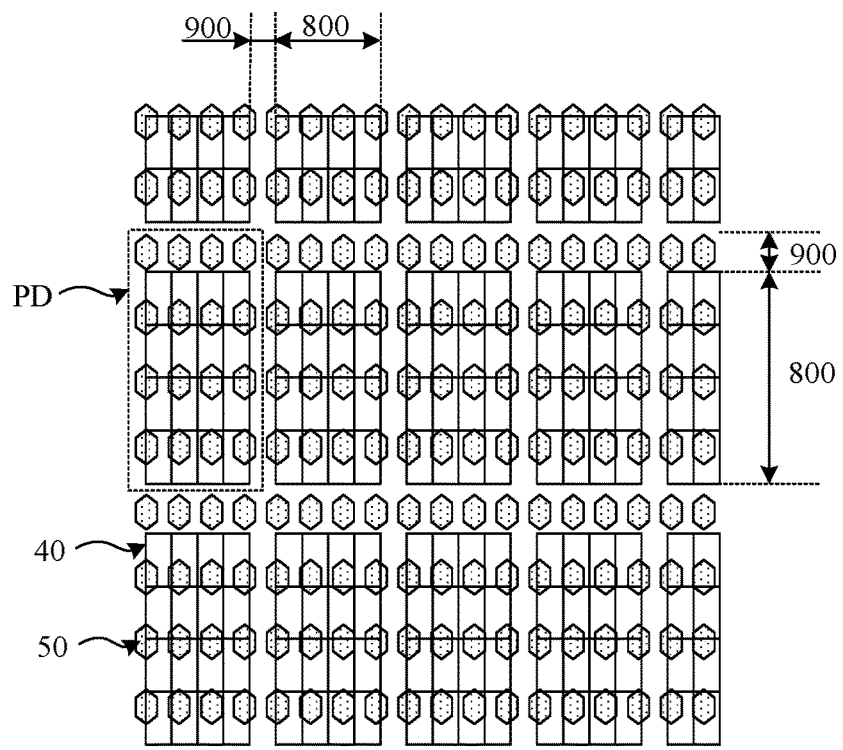
FIG. 16 is a schematic diagram of an arrangement of pixel islands in a display region according to an exemplary embodiment of the present disclosure.
Figure 17:
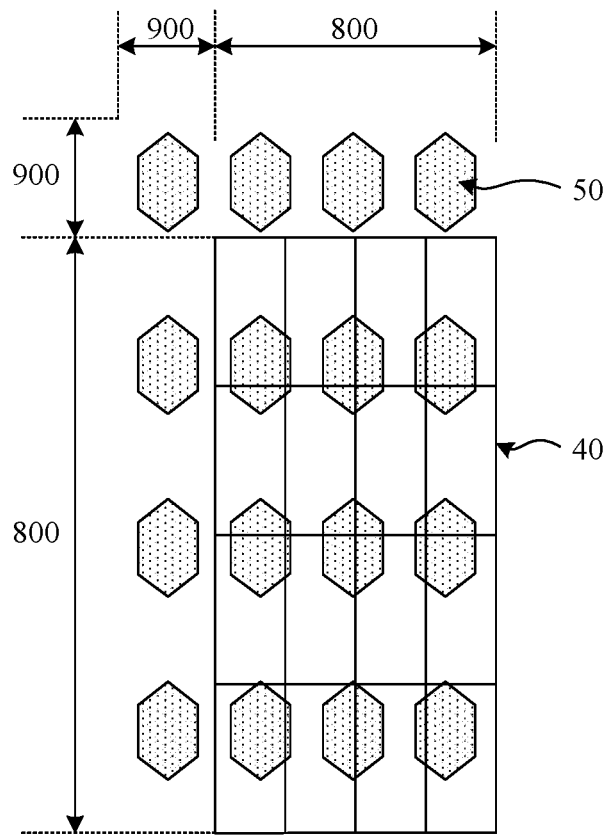
FIG. 17 is a schematic diagram of a compressed arrangement in a pixel island according to an exemplary embodiment of the present disclosure.

FIG. 16 is a schematic diagram of an arrangement of pixel islands in a display region according to an exemplary embodiment of the present disclosure, and FIG. 17 is a schematic diagram of a compressed arrangement of a pixel island according to an exemplary embodiment of the present disclosure. As shown in FIGS. 16 and 17, the display region may include a plurality of pixel islands PD arranged regularly, and each pixel island PD may include a plurality of sub-pixels. In a plane direction to the display substrate, at least one pixel island PD may include a circuit sub-area 800 and a wiring sub-area 900. The circuit sub-area 800 is arranged to accommodate a pixel driving circuit of the plurality of sub-pixels in the pixel island PD, and the wiring sub-area 900 is arranged to accommodate data fanout lines.

In an exemplary implementation, in a direction perpendicular to the display substrate, each sub-pixel may at least include a driving circuit layer arranged on the substrate and a light emitting structure layer arranged on a side, away from the substrate, of the driving circuit layer; the driving circuit layer may include a pixel driving circuit 40; the pixel driving circuit 40 may include a plurality of transistors and memory capacitors; the light emitting structure layer may include a light emitting device 50; the light emitting device 50 may include an anode, an organic light-emitting layer, and a cathode; the light emitting device 50 is connected to the pixel driving circuit 40, and driven by the pixel driving circuit 40 to emit light of a corresponding brightness.

In a display substrate, the pixel driving circuit and the light emitting device of each sub-pixel are arranged in an alignment manner, the light emitting device is located right above the pixel driving circuit of the sub-pixel, and an orthographic projection of the light emitting device on the substrate is within a range of an orthographic projection of the pixel driving circuit on the substrate, that is, an array period of the pixel driving circuit is the same as an array period of the light emitting device. Because the plurality of sub-pixels in the display regions are uniformly arranged, the pixel driving circuits in the display region are uniformly arranged, and the light emitting devices are also uniformly arranged. In the exemplary embodiment of the present disclosure, the pixel driving circuit and the light emitting device of each sub-pixel in the pixel island PD are arranged in a dislocation manner, an accommodation space is provided to the data fanout lines by compressing the occupied area of the pixel driving circuit of each sub-pixel.

In FIG. 16 and FIG. 17, each rectangle represents a region occupied by the pixel driving circuit 40 of each sub-pixel, and each hexagon represents a region occupied by the light emitting device 50 (anode) of each sub-pixel. In an exemplary implementation, a plurality of light emitting devices 50 in the pixel island PD are uniformly arranged in a region of the pixel island PD. Compared with the conventional manner of uniformly arranging the light emitting devices in the region of the pixel island PD, the arrangement position and occupied area of the light emitting devices in the exemplary embodiment of the present disclosure are the same as those in the conventional arrangement manner of the light emitting devices, which refers to a normal arrangement. In the display region, a consecutive array of light emitting devices is formed, so that normal picture displaying can be ensured, and introduction of a new mask is avoided. In an exemplary implementation, a plurality of pixel driving circuits 40 in the pixel island PD are uniformly arranged in the circuit sub-area 800. Compared with the conventional manner of uniformly arranging the pixel driving circuits in the region of the pixel island PD, the arrangement position and occupied area of the pixel driving circuits in the exemplary embodiment of the present disclosure are different from those in the conventional arrangement manner of the pixel driving circuit, which refers to a compressed arrangement. In the display region, an intermittent array of pixel driving circuits is formed. Thus, the region occupied by the plurality of pixel driving circuits 40 in the pixel island PD is less than the region occupied by the plurality of light emitting devices 50, so that the wiring sub-area 900 for accommodating the data fanout lines may be formed in the driving circuit layer.

Figure 18A:
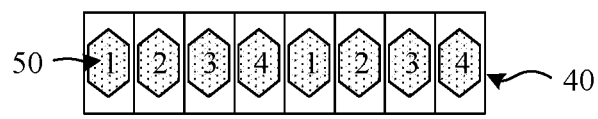
FIGS. 18A to 18B are schematic diagrams of a compressed arrangement according to an exemplary embodiment of the present disclosure.
Figure 18B:
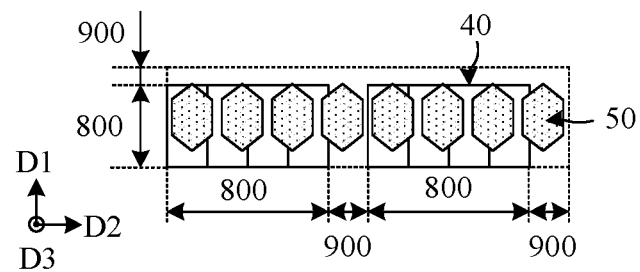

FIGS. 18A to 18B are schematic diagrams of a compressed arrangement according to an exemplary embodiment of the present disclosure. In an exemplary implementation, a pixel island may include four sub-pixels. In the normal arrangement, a pixel driving circuit 40 and a light emitting device 50 of each sub-pixel are arranged in an alignment manner, the light emitting device 50 is located right above the pixel driving circuit 40 of the sub-pixel, an orthographic projection of the light emitting device 50 on the substrate is within a range of an orthographic projection of the pixel driving circuit 40 on the substrate, as shown in FIG. 18A. In the compressed arrangement according to the exemplary embodiment of the present disclosure, the light emitting devices 50 are still uniformly arranged in the pixel island, which is the same as that in the normal arrangement. However, four pixel driving circuits 40 in the pixel island are compressed in a circuit sub-area 800, so that a wiring sub-area 900 is respectively formed on a side of a first direction D1 and a side of a second direction D2 of the pixel island, as shown in FIG. 18B. Thus, the four pixel driving circuits 40 and the four light emitting devices 50 in the pixel island are arranged in a dislocation manner. The four pixel driving circuits 40 are correspondingly connected to four light emitting devices 50.

In an exemplary implement ion, the pixel island is compressed both in the first direction D1 and the second direction D2. In the first direction D1, a width occupied by the circuit sub-area 800 may be about 10-30% of a width of the sub-pixel. In the second direction D2, a length occupied by the circuit sub-area 800 may be equal to a length of three sub-pixels.

Figure 19A:
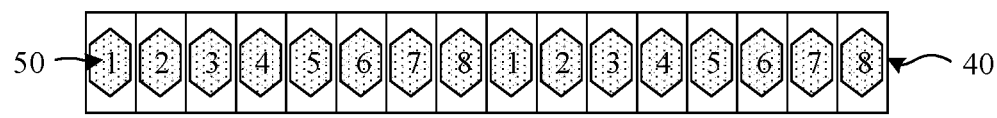
FIGS. 19A to 19B are schematic diagrams of another compressed arrangement according to an exemplary embodiment of the present disclosure.
Figure 19B:
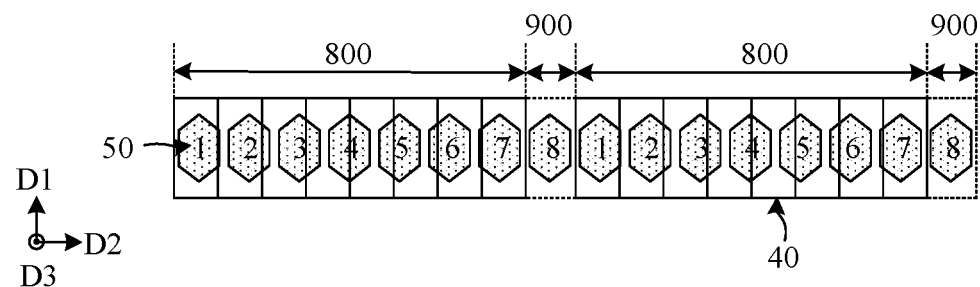

FIGS. 19A to 19B are schematic diagrams of another compressed arrangement according to an exemplary embodiment of the present disclosure. In an exemplary implementation, a pixel island may include eight sub-pixels. In the normal arrangement, a pixel driving circuit 40 and a light emitting device 50 of each sub-pixel are arranged in an alignment manner, the light emitting device 50 is located right above the pixel driving circuit 40 of the sub-pixel, an orthographic projection of the light emitting device 50 on the substrate is within a range of an orthographic projection of the pixel driving circuit 40 on the substrate, as shown in FIG. 19A. In the compressed arrangement according to the exemplary embodiment of the present disclosure, the light emitting devices 50 are still uniformly arranged in the pixel island, which is the same as that in the normal arrangement. However, eight pixel driving circuits 40 in the pixel island are compressed in a circuit sub-area 800, so that a wiring sub-area 900 is respectively formed on a side of a second direction D2 of the pixel island, as shown in FIG. 19B. Thus, the eight pixel driving circuits 40 and the eight light emitting devices 50 in the pixel island are arranged in a dislocation manner. The eight pixel driving circuits 40 are correspondingly connected to the eight light emitting devices 50.

In an exemplary implementation, the pixel islands can only be compressed in the second direction D2. In the second direction D2, a length occupied by the circuit sub-area 800 may be equal to a length of seventh sub-pixels.

In an exemplary implementation, the number of sub-pixels included in each pixel island in the display region may be the same or may be different. For example, among a plurality of pixel islands in the display region, a part of the pixel islands each may include eight pixels, and the other part of the pixel islands each may include sixteen sub-pixels. The size of the pixel islands in the display region may be set according to actual requirements, which is not limited in the present disclosure.

In an exemplary implementation, the compression manner of each pixel island in the display region may be the same or may be different. For example, among the plurality of pixel islands in the display region, a part of the pixel islands can be compressed in the first direction, another part of the pixel islands can be compressed in the second direction, and still another part of the pixel islands can be compressed in both the first direction and the second direction; the circuit sub-area can be arranged on one side of the pixel island, or arranged on a plurality of sides of the pixel island, which are not limited in the present disclosure.

In an exemplary implementation, the wiring sub-area may be located on a side of the circuit sub-area in the first direction, or the wiring sub-area may be located on a side of the circuit sub-area in a direction opposite to the first direction, and the wiring sub-area may be located on a side of the circuit sub-area in the second direction, or the wiring sub-area may be located on a side of the circuit sub-area in a direction opposite to the second direction.

Figure 20:
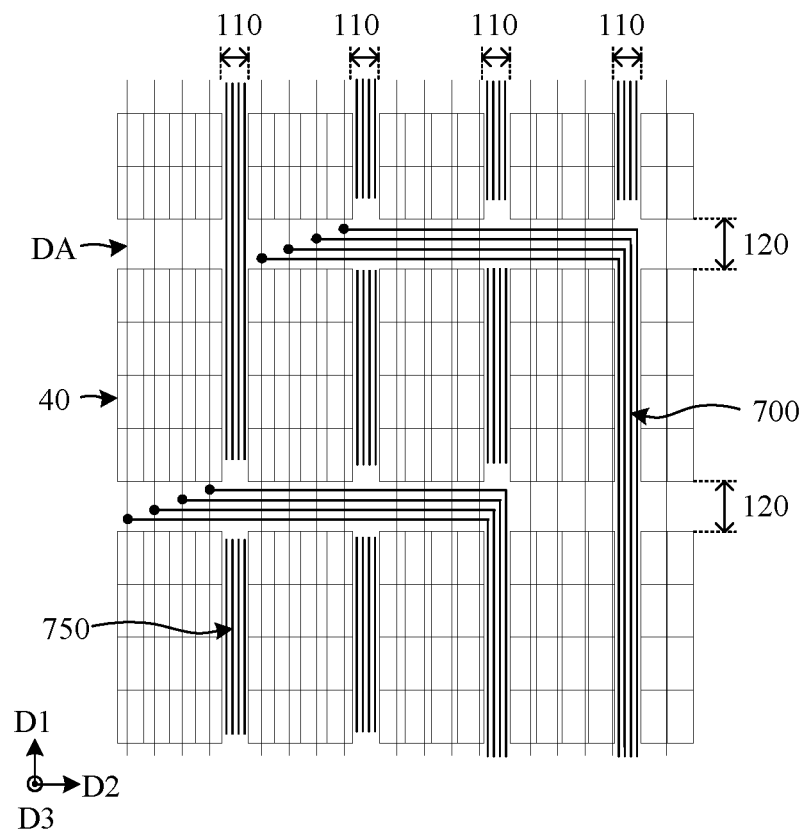
FIGS. 20 and 21 are schematic diagrams of an arrangement of data fanout lines according to an exemplary embodiment of the present disclosure.
Figure 21:
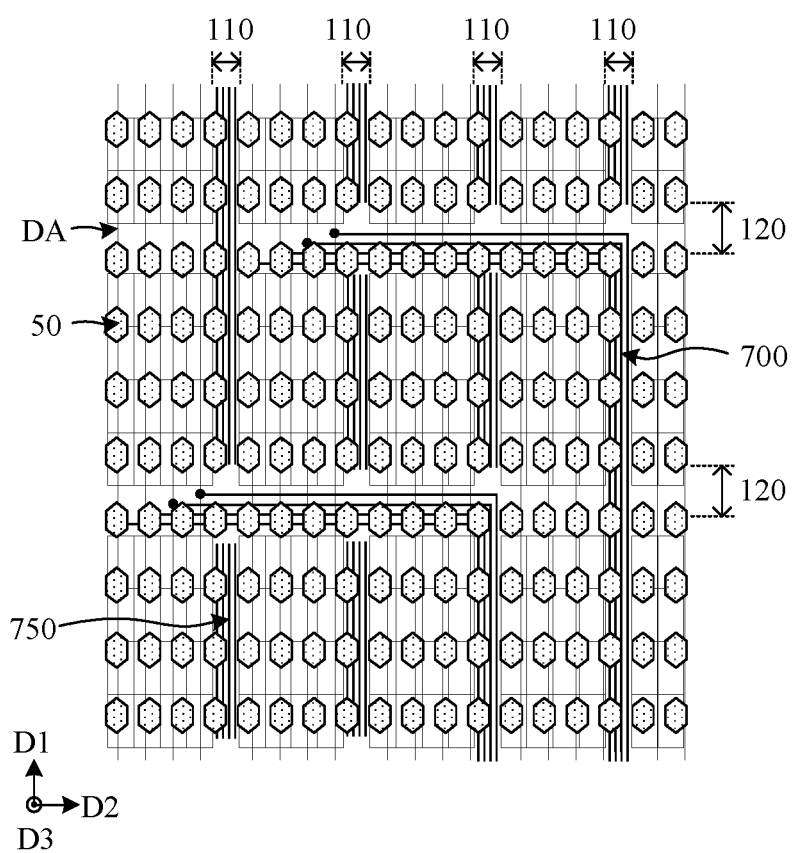

FIG. 20 and FIG. 21 are schematic diagrams of an arrangement of data fanout lines according to an exemplary embodiment of the present disclosure. As shown in FIG. 20 and FIG. 21, the display region may include a plurality of pixel islands arranged regularly, each pixel island may be provided with a plurality of pixel driving circuits 40 and a plurality of light emitting devices 50, at least one pixel island may include a circuit sub-area and a wiring sub-area, and a plurality of wiring sub-areas form a wiring area in the display region. In an exemplary implementation, the wiring region may include at least one first wiring area 110 extending along a first direction D1 and at least one second wiring area 120 extending along a second direction D2.

In an exemplary implementation, data fanout lines 700 may be arranged in the first wiring area 110 and the second wiring area 120. A first end of each data fanout line 700 is connected to a lead wire in a lead area, and a second end of each data fanout line 700 extends along the first wiring area 110 and the second wiring area 120, and is correspondingly connected to a corresponding data line DA.

In an exemplary implementation, the wiring area formed by compressing the pixel driving circuit has a certain width, such that a plurality of data fanout lines 700 can be arranged in one first wiring area 110 or one second wiring area 120, which can not only reduce difficulty in arrangement design of the data fanout lines but be conductive to controlling extension lengths of the data fanout lines.

In an exemplary implementation mode, light-emitting devices 50 are uniformly arranged, which is the same as the conventional arrangement manner of light-emitting devices. Therefore, part of the light-emitting devices 50 and the wiring area have an overlap region, and an orthographic projection of at least one of the light-emitting devices 50 on a plane of the display substrate and an orthographic projection of the data fanout line 700 on the plane of the display substrate have an overlap region.

In an exemplary implementation, the first wiring area 110 or the second wiring area 120 where the data fanout lines 700 are not arranged may be provided with virtual fanout lines 750, and the virtual fanout lines 750 may extend along the first direction D1, or may extend along the second direction D2. According to the exemplary embodiment of the present disclosure, the virtual fanout lines 750 are arranged in the first wiring area 110 or the second wiring area 120 that is idle, so that the uniformity of the preparation process for the display substrate can be improved, and the preparation quality is improved.

In an exemplary implementation, the number of virtual fanout lines 750 arranged in at least one first wiring area 110 may be the same as the number of data fanout lines 700 arranged in other first wiring areas 110, and the number of virtual fanout lines 750 arranged in at least one second wiring area 120 may be the same as the number of data fanout lines 700 arranged in other second wiring areas 120.

According to the exemplary embodiment of the present disclosure, the technical effects of the foregoing embodiments can be achieved, including effectively narrowing the lower border, effectively avoiding size deviation of two film layers, and effectively improving the display uniformity and display quality. According to the exemplary embodiment of the present disclosure, on the premise of ensuring normal screen displaying, the compressed arrangement of the pixel driving circuits is adopted to form a plurality of wiring areas in the display region, and the data fanout lines can extend in the wiring areas and be connected to the corresponding data lines, so that the difficulty in arrangement design of the data fanout lines is effectively reduced, uniformity and orderliness of the arrangement of the data fanout lines are improved, redesigning of sub-pixels as well as introducing of new masks is avoided, and costs for design and production are effectively lowered.

An exemplary embodiment of the present disclosure also provides a preparation method for a display substrate; the display substrate includes a display region and a bonding region on one side of the display region, the bonding region at least including a lead area; the preparation method includes the following operations.

A plurality of data lines and a plurality of data fanout lines are formed in the display region, and a plurality of lead wires are formed in the lead area, herein orthographic projections of the plurality of data lines and the plurality of data fanout lines on a plane of the display substrate are at least partially overlapped; a first end of at least one data fanout line is connected to the lead wire, and a second end of the at least one data fanout line is connected to the data line after the second end extends in a direction away from the lead area.

An exemplary embodiment of the present disclosure also provides a display device, which includes the display substrate in the foregoing embodiments. The display device may be any product or component with a display function, such as a mobile phone, a tablet computer, a television, a display, a notebook computer, a digital photo frame, a navigator, an advertising panel, a smart watch, an E-book portable multimedia player, or a display screen of various products of Internet of Things. In an exemplary implementation, the display device may be a wearable display device, which can be worn on a human body in some manners, such as a smart watch, and a smart bracelet.

The accompanying drawings of the present disclosure only involve the structures involved in the present disclosure, and the other structures may refer to conventional designs. The embodiments in the present disclosure, i.e., the features in the embodiments, can be combined to obtain new embodiments if there are no conflicts.

Those of ordinary skill in the art should know that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
 a display region and a bonding region on a side of the display region, wherein the bonding region at least comprises a lead area; the display region comprises a plurality of data lines and a plurality of data fanout lines, the lead area comprises a plurality of lead wires, orthographic projections of the plurality of data lines and the plurality of data fanout lines on a plane of the display substrate are at least partially overlapped; a first end of at least one data fanout line is connected to a lead wire, and a second end of the at least one data fanout line extends in a direction away from the lead area, to be connected to a data line, wherein
 at least one data fanout line comprises a first line segment and a second line segment; a first end of the first line segment is connected to the lead wire, and a second end of the first line segment extends along a second direction or an opposite direction of the second direction, to be connected to a first end of the second line segment; a second end of the second line segment extends in a direction away from the lead area, to be connected to the data line through a via hole; the second direction is intersected with the first direction, and the first direction is parallel to the data line;
 wherein
 in a direction parallel to the display substrate, the display substrate has a second center line, and the second center line extends along the second direction and equally divides pixel rows of the display region; the via through which any one of the data fanout lines is connected to the data line has a distance L1 from the second center line, the distance L1 satisfying:
 L1≤0.2 * a length of the data line in the display region; wherein
 the length and the distance refer to dimensions in the first direction; and wherein
 all of via holes through which the data fanout lines are connected with the data lines are located on the second center line.

2. The display substrate according to claim 1, wherein a number of data fanout lines is equal to a number of the data lines.

3. The display substrate according to claim 1, wherein in a direction parallel to the display substrate, the display substrate has a first center line, and the first center line extends along a first direction and equally divides pixel columns of the display region, the first direction being parallel to the data lines; on a side of the first center line, the plurality of data lines comprise a first data line, a second data line, . . . , and an Nth data line that are arranged in sequence along a second direction or an opposite direction of the second direction, the second direction intersecting the first direction; the plurality of data fanout lines comprise a first data fanout line, a second data fanout line, . . . , and an Nth data fanout line that are arranged in sequence along the second direction or the opposite direction of the second direction; the plurality of lead wires comprise a first lead wire, a second lead wire, . . . , and an Nth lead wire that are arranged in sequence along the second direction or the opposite direction of the second direction; an orthographic projection of any one of the data fanout lines on the plane of the display substrate and orthographic projections of other data fanout lines on the plane of the display substrate have no overlap region; an orthographic projection of any one of the lead wires on the plane of the display substrate and orthographic projections of other lead wires on the plane of the display substrate have no overlap region; and N refers to a number of the data lines in the display region.

4. The display substrate according to claim 1, wherein the plurality of lead wires in the lead area have the same width, adjacent lead wires have a same spacing, and the spacing between the adjacent lead wires is less than the spacing between the adjacent data lines.

5. The display substrate according to claim 1, wherein the second line segment comprises a second extension segment and a connecting segment; a first end of the second extension segment is connected to the second end of the first line segment, and a second end of the second extension segment extends in a direction away from the lead area, to be connected to a first end of the connecting segment; and a second end of the connecting segment extends along the second direction or the opposite direction of the second direction, to be connected to the data line through a via hole.

6. The display substrate according to claim 1, wherein any one of the data fanout lines has an extension length L2 in the display region, the extension length L2 satisfying:

$|L2i-L2j|/L2i \leq 0.2$, or $|L2i-L2j|/L2j \leq 0.2$;

wherein L2i is an extension length of one data fanout line in the display region, L2j is an extension length of another data fanout line in the display region, and the extension length of the data fanout line is a sum of an extension length of the first line segment and an extension length of the second line segment.

7. The display substrate according to claim 6, wherein a plurality of via holes through which the data fanout lines are connected with the data lines have different distances from the second center line.

8. The display substrate according to claim 1, wherein in a direction perpendicular to the display panel, the display substrate comprises a first conductive layer, a second conductive layer, and a third conductive layer, and an insulating layer is arranged between the first conductive layer and the second conductive layer, as well as between the second conductive layer and the third conductive layer; and the data lines and the data fanout lines are arranged in different conductive layers.

9. The display substrate according to claim 8, wherein the data fanout lines comprise odd data fanout lines and even data fanout lines, the odd data fanout lines are connected to the data lines in odd columns, and the even data fanout lines are connected to the data lines in even columns; and the odd data fanout lines and the even data fanout lines are arranged in different conductive layers.

10. The display substrate according to claim 9, wherein the lead wires comprise odd lead wires and even lead wires, the odd lead wires are connected to the data lines in odd columns through the odd data fanout lines, and the even lead wires are connected to the data lines in even columns through the even data fanout lines; the odd lead wires and the odd data fanout lines are arranged in a same layer and are of an integrated structure connected to each other, and the even lead wires and the even data fanout lines are arranged in a same layer and are of an integrated structure connected to each other.

11. The display substrate according to claim 9, wherein the odd data fanout lines are arranged in the first conductive layer, the even data fanout lines are arranged in the second conductive layer, and the data lines are arranged in the third conductive layer; or, the even data fanout lines are arranged in the first conductive layer, the odd data fanout lines are arranged in the second conductive layer, and the data lines are arranged in the third conductive layer; and the first conductive layer and the second conductive layer are made of a same material.

12. The display substrate according to claim 1, wherein in the direction parallel to the display substrate, the display substrate comprises a plurality of pixel islands, the pixel islands each comprising a plurality of sub-pixels; in the direction perpendicular to the display substrate, the sub-pixel comprises a driving circuit layer arranged on a substrate and a light emitting structure layer arranged on a side, away from the substrate, of the driving circuit layer, the driving circuit layer comprising a pixel driving circuit, and the light emitting structure layer comprising a light emitting device connected to the pixel driving circuit; and at least one pixel island comprises a circuit sub-area and a wiring sub-area, pixel driving circuits of the plurality of sub-pixels in the pixel island are arranged in the circuit sub-area, and the data fanout lines are arranged in the wiring sub-area.

13. The display substrate according to claim 12, wherein an orthographic projection of at least one light emitting device in the pixel island on the plane of the display substrate and an orthographic projection of the data fanout line on the plane of the display substrate have an overlap region.

14. The display substrate according to claim 12, wherein a virtual fanout line is further arranged in the wiring sub-area.

15. A display device, comprising the display substrate according to claim 1.

16. The display substrate according to claim 1, wherein the first line segment comprises a lead-out segment and a first extension segment; a first end of the lead-out segment is connected to the lead wire, and a second end of the lead-out segment extends in a direction away from the lead area, to be connected to a first end of the first extension segment; a second end of the first extension segment extends along the second direction or the opposite direction of the second direction, to be connected to the first end of the second line segment, and a spacing between adjacent lead-out segments is less than a spacing between adjacent data lines.

17. A preparation method for a display substrate, wherein the display substrate comprises a display region and a bonding region on a side of the display region, the bonding region at least comprising a lead area; and the preparation method comprises:

forming a plurality of data lines and a plurality of data fanout lines in the display region, and forming a plurality of lead wires in the lead area, wherein orthographic projections of the plurality of data lines and the plurality of data fanout lines on a plane of the display substrate are at least partially overlapped; a first end of at least one of the data fanout lines is connected with a lead wire, and a second end of the at least one of the data fanout lines is connected with a data line after the second end extends in a direction away from the lead area, wherein at least one data fanout line comprises a first line segment and a second line segment; a first end of the first line segment is connected to the lead wire, and a second end of the first line segment extends along a second direction or an opposite direction of the second direction, to be connected to a first end of the second line segment; a second end of the second line segment extends in a direction away from the lead area, to be connected to the data line through a via hole; the second direction is intersected with the first direction, and the first direction is parallel to the data line;

wherein in a direction parallel to the display substrate, the display substrate has a second center line, and the second center line extends along the second direction and equally divides pixel rows of the display region; the via through which any one of the data fanout lines is connected to the data line has a distance L1 from the second center line, the distance L1 satisfying:

L1≤0.2 * a length of the data line in the display region;
wherein
the length and the distance refer to dimensions in the first direction; and wherein
all of via holes through which the data fanout lines are connected with the data lines are located on the second center line.

* * * * *

UNITED STATES PATENT AND TRADEMARK OFFICE
CERTIFICATE OF CORRECTION

| | | |
|---|---|---|
| PATENT NO. | : 12,367,835 B2 | Page 1 of 1 |
| APPLICATION NO. | : 17/627808 | |
| DATED | : July 22, 2025 | |
| INVENTOR(S) | : Lili Du et al. | |

It is certified that error appears in the above-identified patent and that said Letters Patent is hereby corrected as shown below:

On the Title Page

The Foreign Application Priority Data Item (30) should be:
January 29, 2021 (CN) ................. PCT/CN2021/074469

Signed and Sealed this
Twenty-sixth Day of August, 2025

Coke Morgan Stewart
*Acting Director of the United States Patent and Trademark Office*